US012616023B2

(12) United States Patent
Igarashi et al.

(10) Patent No.: US 12,616,023 B2
(45) Date of Patent: Apr. 28, 2026

(54) SEMICONDUCTOR DEVICE

(71) Applicant: RENESAS ELECTRONICS CORPORATION, Tokyo (JP)

(72) Inventors: Takayuki Igarashi, Tokyo (JP); Tatsuo Kasaoka, Tokyo (JP); Yasutaka Nakashiba, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 495 days.

(21) Appl. No.: 18/344,431

(22) Filed: Jun. 29, 2023

(65) Prior Publication Data

US 2024/0096788 A1       Mar. 21, 2024

(30) Foreign Application Priority Data

Sep. 21, 2022    (JP) ................................. 2022-150352

(51) Int. Cl.
H01L 23/522 (2006.01)
H01L 23/528 (2006.01)
*H01L 23/532* (2006.01)

(52) U.S. Cl.
CPC ...... H01L 23/5227 (2013.01); H01L 23/5283 (2013.01); *H01L 23/5226* (2013.01); *H01L 23/53214* (2013.01); *H01L 23/53257* (2013.01)

(58) Field of Classification Search
CPC ............. H01L 23/5227; H01L 23/5283; H01L 23/5226; H01L 23/53214; H01L 23/53257; H01L 23/585
See application file for complete search history.

(56) References Cited

U.S. PATENT DOCUMENTS

2020/0027908 A1*    1/2020   Paul ...................... H10D 86/01

FOREIGN PATENT DOCUMENTS

JP          2011-082212 A      4/2011
WO       WO-2020084928 A1 *   4/2020   ............. H01F 17/00

* cited by examiner

*Primary Examiner* — Dale E Page
*Assistant Examiner* — Daniel J Hibbert
(74) *Attorney, Agent, or Firm* — Rimon P.C.

(57) ABSTRACT

A semiconductor chip includes a lower wiring layer, a multilayer wiring layer formed on the lower wiring layer, and an upper wiring layer formed on the multilayer wiring layer. Here, a thickness of a wiring provided in the lower wiring layer is larger than a thickness of each of a plurality of wirings provided in the multilayer wiring layer, and a thickness of a wiring provided in the upper wiring layer is larger than the thickness of each of the plurality of wirings provided in the multilayer wiring layer. A lower inductor which is a component of a transformer is provided in the lower wiring layer, and an upper inductor which is a component of the transformer is provided in the upper wiring layer.

15 Claims, 20 Drawing Sheets

SEMICONDUCTOR DEVICE

CROSS-REFERENCE TO RELATED APPLICATIONS

The disclosure of Japanese Patent Application No. 2022-150352 filed on Sep. 21, 2022, including the specification, drawings and abstract is incorporated herein by reference in its entirety.

BACKGROUND

The present disclosure relates to a semiconductor device and, more particularly, to a technique applicable to a semiconductor device capable of transmitting signals between different potentials by using a pair of inductors coupled inductively.

There are disclosed techniques listed below.
[Patent Document 1] Japanese Unexamined Patent Application Publication No. 2011-82212

Patent Document 1 describes a technique capable of increasing the coil cross-sectional area without hindering miniaturization in order to reduce the series resistance which occupies most of the parasitic resistance components of the coils configuring the transformer.

SUMMARY

For example, there is a transformer (digital isolator) that enables contactless signal transmission by using a pair of inductors coupled inductively. Since this transformer allows signal transmission in a non-contact state, the electrical noise from one circuit can be suppressed from adversely affecting the other circuit. In addition, in the transformer configured as described above, improvement in the breakdown voltage is desired so as to enable non-contact signal transmission between circuits having large different potentials from each other.

In one embodiment, a semiconductor device includes a lower wiring layer, a multilayer wiring layer formed on the lower wiring layer, and an upper wiring layer formed on the multilayer wiring layer. Here, the lower wiring layer includes a first wiring, the multilayer wiring layer includes a second wiring, and the upper wiring layer includes a third wiring. In this case, the first wiring has a thickness greater than a thickness of the second wiring, and the third wiring has a thickness greater than the thickness of the second wiring. The lower wiring layer includes a lower inductor being a component of a transformer, and the upper wiring layer includes an upper inductor being a component of the transformer.

According to one embodiment, the reliability of the semiconductor device can be improved.

BRIEF DESCRIPTION OF THE DRAWINGS

FIG. 4 is a diagram showing a three-chip configuration.

FIG. 20 is a schematic cross-sectional view of a semiconductor chip according to a fourth modified example.

FIG. 21 is a schematic cross-sectional view of a semiconductor chip according to a fifth modified example.

DETAILED DESCRIPTION

Figure 1:
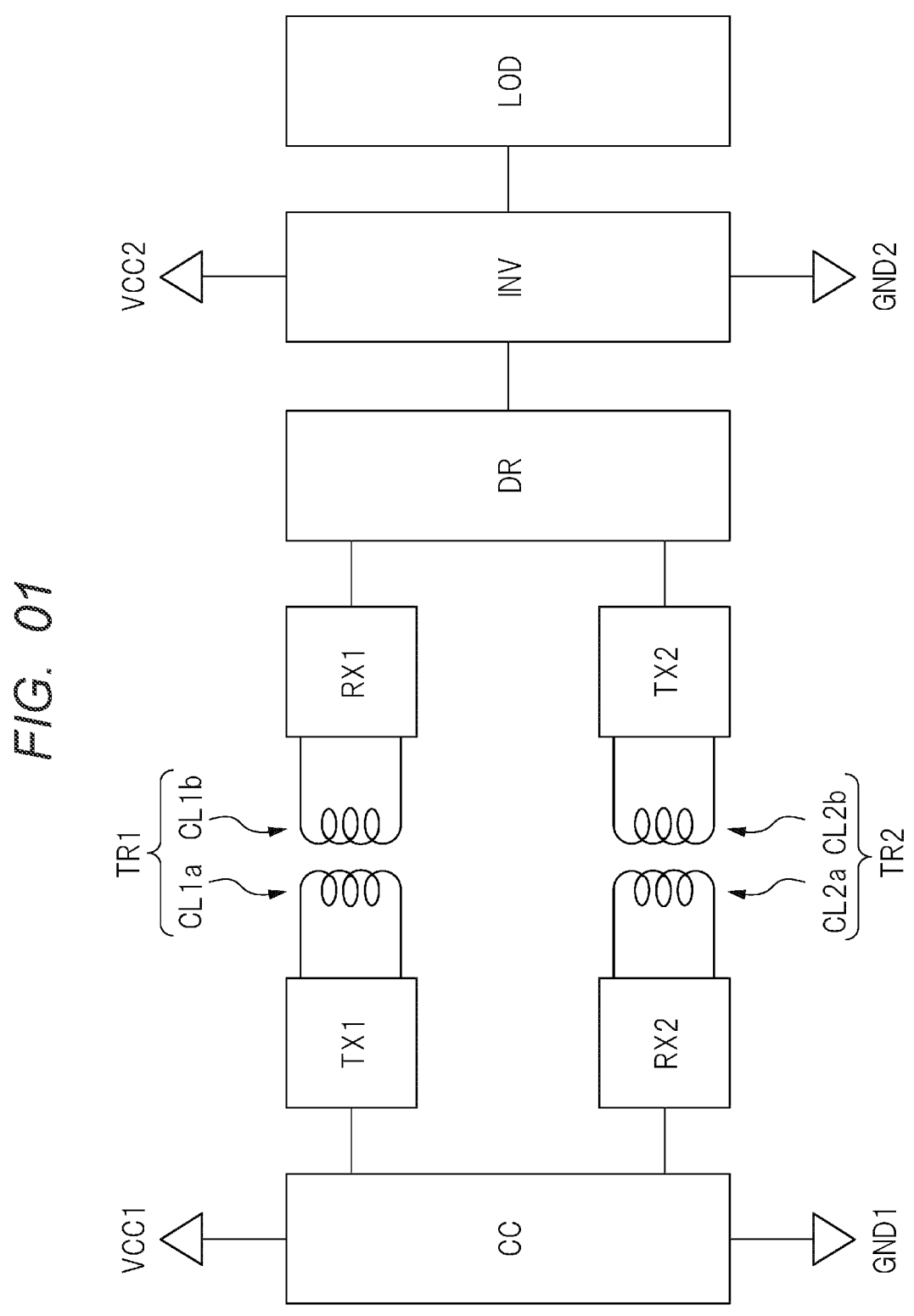
FIG. 1 is a diagram showing a configuration example of a drive control unit that drives a load circuit.

In all the drawings for explaining the embodiments, the same members are denoted by the same reference numerals in principle, and repetitive descriptions thereof are omitted. Note that even plan view may be hatched for the sake of clarity.

Circuit Configuration

FIG. 1 is a diagram showing a configuration example of a drive control unit that drives a load circuit such as a motor.

As shown in FIG. 1, the drive control unit includes a control circuit CC, a transformer TR1, a transformer TR2, a drive circuit DR, and an inverter INV, and is electrically connected to a load circuit LOD.

The drive control unit further includes a transmitting circuit TX1, a receiving circuit RX1, a transmitting circuit TX2, and a receiving circuit RX2. The transmitting circuit TX1 and the receiving circuit RX1 transmit a control signal outputted from the control circuit CC to the drive circuit DR. On the other hand, the transmitting circuit TX2 and the receiving circuit RX2 transmit a signal outputted from the drive circuit DR to the control circuit CC. The control circuit CC controls the drive circuit DR. The drive circuit DR operates the inverter INV that controls the load circuit LOD based on the control from the control circuit CC.

A power supply potential VCC1 is supplied to the control circuit CC, and the control circuit CC is grounded by a ground potential GND1. On the other hand, a power supply potential VCC2 is supplied to the inverter INV, and the inverter INV is grounded by a ground potential GND2. For example, the power supply potential VCC1 supplied to the control circuit CC is smaller than the power supply potential VCC2 supplied to the inverter INV. In other words, the power supply potential VCC2 supplied to the inverter INV is larger than the power supply potential VCC1 supplied to the control circuit CC.

The transformer TR1 is formed of a coil (inductor) CL1a and a coil CL1b inductively coupled to each other. The inductively coupled coil CL1a and coil CL1b are interposed between the transmitting circuit TX1 and the receiving circuit RX1. Thus, it is possible to transmit a signal from the transmitting circuit TX1 to the receiving circuit RX1 via the transformer TR1. Consequently, the drive circuit DR can receive the control signal outputted from the control circuit CC via the transformer TR1.

As described above, by the transformer TR1 electrically isolated by using the inductive coupling, it is possible to transmit the control signal from the control circuit CC to the drive circuit DR while suppressing the transmission of the electric noise from the control circuit CC to the drive circuit DR. Therefore, a malfunction of the drive circuit DR caused by the superimposition of the electric noises on the control signal can be suppressed resulting in improvement on the operation reliability of the semiconductor device.

The coil CL1a and the coil CL1b configuring the transformer TR1 each function as an inductor. The transformer TR1 functions as a magnetically coupled element formed of the inductively coupled coil CL1a and coil CL1b.

Similarly, the transformer TR2 formed of inductively coupled coil CL2b and coil CL2a is interposed between the transmitting circuit TX2 and the receiving circuit RX2. Thus, it is possible to transmit a signal from the transmitting circuit TX2 to the receiving circuit RX2 via the transformer TR2. Consequently, the control circuit CC can receive the signal outputted from the drive circuit DR via the transformer TR2.

As described above, electrically isolating the transformer TR2 using the inductive coupling allows a signal to be transmitted from the control circuit CC to the drive circuit DR while suppressing the transmission of the electric noise from the control circuit CC to the drive circuit DR. Therefore, a malfunction of the drive circuit DR caused by the superimposition of the electric noises on the control signal can be suppressed resulting in improvement on the operation reliability of the semiconductor device.

The transformer TR1 is configured by the coil CL1a and the coil CL1b, and the coil CL1a and the coil CL1b are not connected by conductors but are magnetically coupled. Therefore, when a current flows in the coil CL1a, a change in the current facilitates an induced electromotive force to be generated in the coil CL1b and an induced current to flow in the coil CL1b. In this case, the coil CL1a is a primary coil, and the coil CL1b is a secondary coil. As described above, the transformer TR1 utilizes the electromagnetically induced phenomena occurring between the coil CL1a and the coil CL1b. That is, as a result of transmitting a control signal from the transmitting circuit TX1 to the coil CL1a of the transformer TR1 to cause a current to flow in the coil CL1a of the transformer TR1, an induced current generated in the coil CL1b of the transformer TR1 is detected by the receiving circuit RX1, so that the receiving circuit RX1 can receive a signal corresponding to the control signal outputted from the transmitting circuit TX1.

Similarly, the transformer TR2 is configured by the coil CL2a and the coil CL2b, and the coil CL2a and the coil CL2b are not connected by conductors but are magnetically coupled. Therefore, when a current flows in the coil CL2b, a change in the current facilitates an induced electromotive force to be generated in the coil CL2a, so that an induced current flows in the coil CL2a. As described above, as a result of transmitting a signal from the transmitting circuit TX2 to the coil CL2b of the transformer TR2 to cause a current to flow in the coil CL2b of the transformer TR2, the induced current generated in the coil CL2a of the transformer TR2 is detected by the receiving circuit RX2, so that the receiving circuit RX2 can receive a signal corresponding to the control signal outputted from the transmitting circuit TX2.

Signals are transmitted and received between the control circuit CC and the drive circuit DR using a path from the transmitting circuit TX1 to the receiving circuit RX1 via the transformer TR1 and using a path from the transmitting circuit TX2 to the receiving circuit RX2 via the transformer TR2. That is, the transmission and reception of the signals between the control circuit CC and the drive circuit DR are performed by having the receiving circuit RX1 receive the signal transmitted from the transmitting circuit TX1 and by having the receiving circuit RX2 receive the signal transmitted from the transmitting circuit TX2. As described above, the transformer TR1 is interposed in the transmission of a signal from the transmitting circuit TX1 to the receiving circuit RX1, and the transformer TR2 is interposed in the transmission of a signal from the transmitting circuit TX2 to the receiving circuit RX2. Thus, the drive circuit DR can drive the inverter INV for operating the load circuit LOD in accordance with the signal transmitted from the control circuit CC.

The control circuit CC and the drive circuit DR have different reference potentials. That is, in the control circuit CC, the reference potential is fixed to the ground potential GND1, while the drive circuit DR is electrically connected to the inverter INV as shown in FIG. 1. The inverter INV includes, for example, a high-side IGBT (Insulated Gate Bipolar Transistor) and a low-side IGBT. The drive circuit DR performs the on/off control of the high-side IGBT of the inverter INV and the on/off control of the low-side IGBT of the inverter INV causing the inverter INV to control the load circuit LOD. Specifically, the on/off control of the high-side IGBT is performed by the drive circuit DR controlling the potential applied to the gate electrode of the high-side IGBT. Similarly, the on/off control of the low-side IGBT is performed by the drive circuit DR controlling the potential applied to the gate electrode of the low-side IGBT.

Here, for example, in order to realize the on-control of the low-side IGBT, the drive-circuit DR controls to apply "emitter potential (0 V)+threshold voltage (15 V)" to the gate electrode with reference to the emitter potential (0 V) of the low-side IGBT connected to the ground potential GND2. On the other hand, for example, in order to realize the off-control of the low-side IGBT, the drive-circuit DR controls to apply an "emitter potential (0 V)" to the gate electrode with reference to the emitter potential (0 V) of the low-side IGBT connected to the ground potential GND2.

Therefore, the on/off control of the low-side IGBT is performed according to whether or not a threshold voltage (15 V) is applied to the gate electrode with 0 V as a reference potential.

On the other hand, for example, the on-control of the high-side IGBT is also performed by whether or not "reference potential+threshold voltage (15 V)" is applied to the gate electrode with respect to the reference potential using the emitter potential of the high-side IGBT as a reference potential.

Unlike the emitter potential of the low-side IGBT, the emitter potential of the high-side IGBT is not fixed to the ground potential GND2. That is, in the inverter INV, the high-side IGBT and the low-side IGBT are connected in series between the power supply potential VCC2 and the ground potential GND2. In the inverter INV, when the high-side IGBT is turned on, the low-side IGBT is turned off, and when the high-side IGBT is turned off, the low-side IGBT is turned on. Therefore, since the low-side IGBT is in an on-state when the high-side IGBT is in an off-state, the emitter potential of the high-side IGBT becomes the ground potential GND2 due to the low-side IGBT being in the on-state.

On the other hand, since the low-side IGBT is in off-state when the high-side IGBT is in on-state, the emitter potential of the high-side IGBT becomes an IGBT bus-voltage. In such case, the on/off control of the high-side IGBT is performed by whether or not "reference potential+threshold voltage (15 V)" is applied to the gate electrode with the emitter potential of the high-side IGBT as a reference potential.

As described above, the emitter potential of the high-side IGBT varies depending on whether the high-side IGBT is in the on-state or the off-state. That is, the emitter potential of the high-side IGBT varies from the ground potential GND2 (0 V) to the power supply potential VCC2 (for example, 800V). Therefore, in order to turn on the high-side IGBT, an "IGBT bus-voltage (800 V)+threshold voltage (15 V)" needs to be applied to the gate electrode with the emitter potential of the high-side IGBT as a reference potential. Therefore, it is necessary for the drive circuit DR that performs the on/off control of the high-side IGBT to detect the emitter potential of the high-side. Therefore, the drive circuit DR is configured to receive the emitter potential of the high-side IGBT. Consequently, the drive circuit DR receives the reference potential of 800 V, and the drive circuit DR controls the high-side IGBT to be turned on by applying the threshold voltage (15 V) to the gate electrode of the high-side IGBT with respect to the reference potential of 800 V. Therefore, a high potential of the order of 800 V is applied to the drive circuit DR.

As described above, the drive control unit includes the control circuit CC that handles the low potential (several tens of volts) and the drive circuit DR that handles the high potential (several hundreds of volts). Therefore, the signal transmission between the control circuit CC and the drive circuit DR requires the signal transmission between the different potential circuits.

In this regard, the signal transmission between the different potential circuits can be performed by performing the signal transmissions between the control circuit CC and the drive circuit DR via the transformer TR1 and the transformer TR2.

As described above, a large potential difference may be generated between the primary coil and the secondary coil of each of the transformer TR1 and the transformer TR2. Conversely, since a large potential difference may occur between the primary coil and the secondary coil, the primary coil and the secondary coil are magnetically coupled instead of being connected by a conductor to transmit signals. Therefore, when forming the transformer TR1, it is important to increase the breakdown voltage between the coil CL1a and the coil CL1b as much as possible from the viewpoint of improving the operation reliability of the semiconductor device. Similarly, when forming the transformer TR2, it is important to increase the breakdown voltage between the coil CL2b and the coil CL2a as much as possible from the viewpoint of improving the operation reliability of the semiconductor device.

Figure 2:
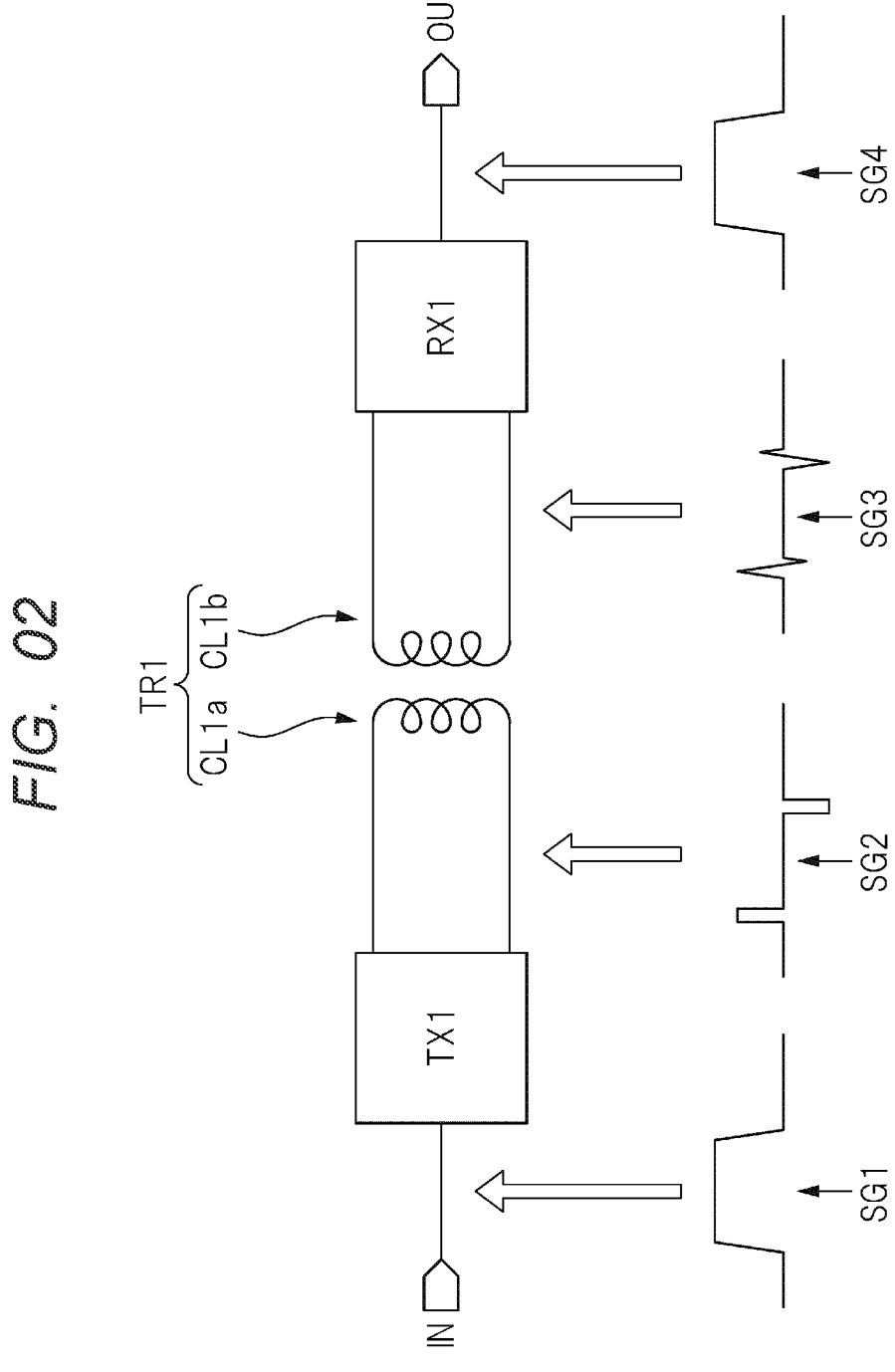
FIG. 2 is an explanatory diagram showing an example of signal transmission.

FIG. 2 is an explanatory diagram showing a transmission example of the signal.

In FIG. 2, the transmitting circuit TX1 extracts an edge part of a signal SG1 of the square wave inputted to the transmitting circuit TX1, generates a signal SG2 having a constant pulse width, and transmits the signal SG2 to the coil CL1a (primary coil) of the transformer TR1. When the current caused by the signal SG2 flows to the coil CL1a (primary coil) of the transformer TR1, a signal SG3 corresponding to the current flows to the coil CL1b (secondary coil) of the transformer TR1 by the induced electromotive force. The receiving circuit RX1 amplifies the signal SG3 and further modulate the signal SG3 into a square wave, such that the receiving circuit RX1 output a signal SG4 of the square wave. Thus, the signal SG4 corresponding to the signal SG1 inputted to the transmitting circuit TX1 can be outputted from the receiving circuit RX1. In this way, it is possible to transmit the signal from the transmitting circuit TX1 to the receiving circuit RX1. The signal transmission from the transmitting circuit TX2 to the receiving circuit RX2 can likewise be carried out.

Two-Chip Configuration

Figure 3:
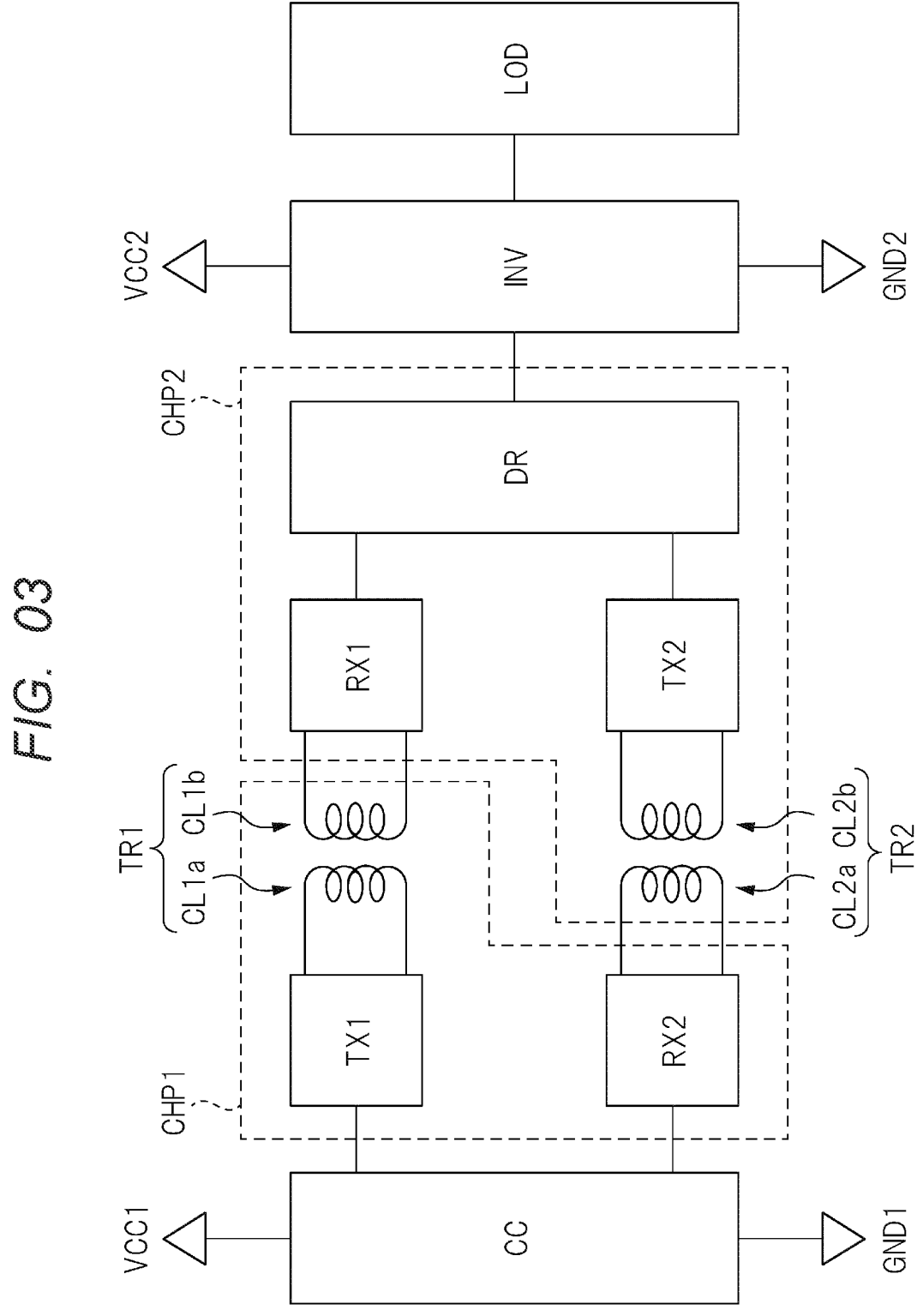
FIG. 3 is a diagram showing a two-chip configuration.

The transmitting/receiving circuits of the above-described drive control unit are formed, for example, by dividing into two semiconductor chips. Specifically, FIG. 3 is a diagram showing a two-chip configuration. In FIG. 3, the two-chip configuration includes a semiconductor chip CHP1 and a semiconductor chip CHP2. The semiconductor chip CHP1 includes the transmitting circuit TX1, the transformer TR1, and the receiving circuit RX2. On the other hand, the semiconductor chip CHP2 includes the receiving circuit RX1, the drive circuit DR, the transmitting circuit TX2, and the transformer TR2. In such a two-chip configuration, for example, the transformer TR1 is formed on the same semiconductor chip CHP1 as the transmitting circuit TX1 and the receiving circuit RX2. Therefore, the transformer TR1, the transmitting circuit TX1, and the receiving circuit RX2 can be integrated. Similarly, the transformer TR2 is formed on the same semiconductor chip CHP2 as the drive circuit DR, the receiving circuit RX1, and the transmitting circuit TX2. Therefore, the transformer TR2, the drive circuit DR, the receiving circuit RX1, and the transmitting circuit TX2 can be integrated.

However, in the two-chip configuration, for example, since the transformer TR1, the transmitting circuit TX1, and the receiving circuit RX2 need to be formed on one semiconductor chip, a manufacturing process of the semiconductor chip CHP1 becomes complicated. Similarly, in the 2-chip configuration, for example, since the transformer TR2, the drive circuit DR, the receiving circuit RX1, and the transmitting circuit TX2 need to be formed on one semiconductor chip, a manufacturing process of the semiconductor chip CHP2 becomes complicated. These complications increase the manufacturing costs of the semiconductor chip CHP1 and the semiconductor chip CHP2.

Three-Chip Configuration

Therefore, it has been studied to realize the above-described transmitting and receiving circuit unit with a three-chip configuration instead of the two-chip configuration. Hereinafter, a novel three-chip configuration will be described.

Figure 04:
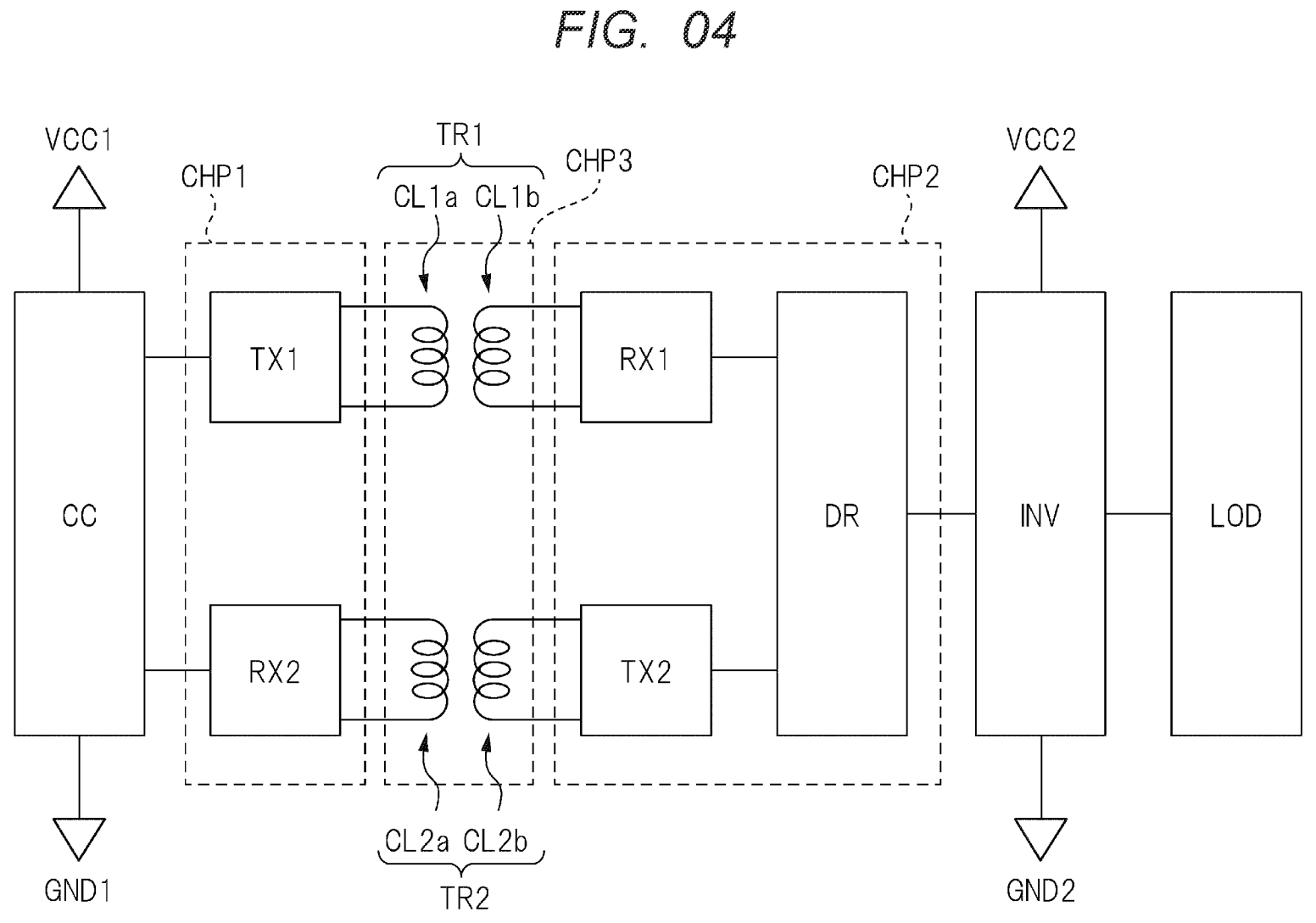

FIG. 4 is a diagram showing the 3-chip configuration. In FIG. 4, The three-chip configuration includes a semiconductor chip CHP1, a semiconductor chip CHP2, and a semiconductor chip CHP3. The semiconductor chip CHP1 includes the transmitting circuit TX1 and the receiving circuit RX2. In addition, the semiconductor chip CHP2 includes the drive circuit DR, the receiving circuit RX1, and the transmitting circuit TX2. On the other hand, the semiconductor chip CHP3 includes the transformer TR1 and the transformer TR2.

Thus, in the three-chip configuration, only the transformer TR1 and the transformer TR2 are formed on the semiconductor chip CHP3. That is, in the three-chip configuration, the semiconductor chip CHP3 can be used if the configurations of the semiconductor chip CHP1 and the semiconductor chip CHP2 change. As a result, the three-chip configuration increases the usable variation of the semiconductor chip CHP1 and the semiconductor chip CHP2. In other words, the versatility of the semiconductor chip CHP3 on which the transformer TR1 and the transformer TR2 are formed can be improved. Further, since the semiconductor chip CHP3 on which the transformer TR1 and the transformer TR2 are formed does not include a transistor, the semiconductor chip CHP3 can be formed only by wiring process, and thus, the manufacturing process of the semiconductor chip CHP3 can be simplified. Therefore, according to the three-chip configuration, the manufacturing cost of the semiconductor chip CHP3 can be reduced, and thus, a highly competitive product can be manufactured.

Planar Layout Configuration of Semiconductor Chip

Subsequently, the planar layout configuration of the semiconductor chip CHP3 is explained.

Figure 5:
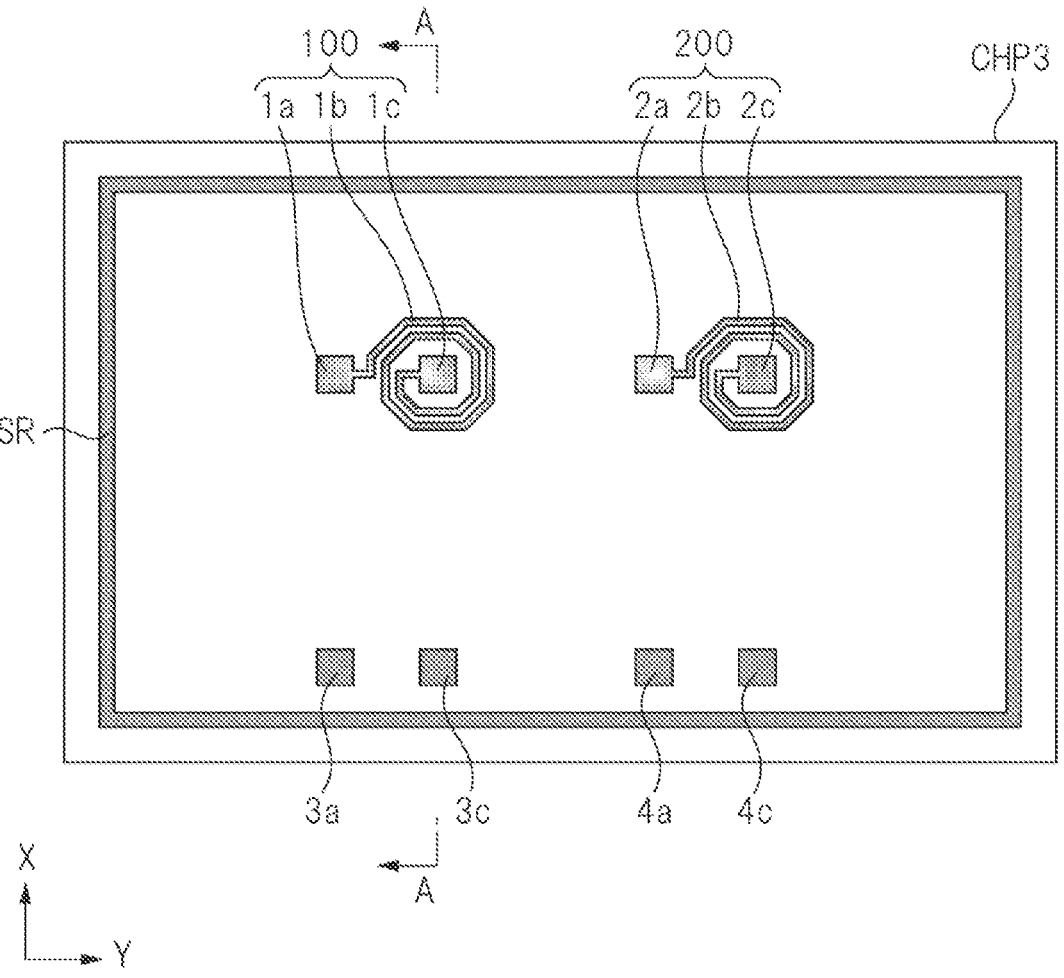
FIG. 5 is a plan view showing a planar layout configuration of a semiconductor chip.

FIG. 5 is a plan view showing a planar layout configuration of the semiconductor chip CHP3.

In FIG. 5, a planar shape of the semiconductor chip CHP3 has a rectangular shape. The semiconductor chip CHP3 includes a seal ring SR at a peripheral edge portion of the semiconductor chip CHP3. In plan view, the semiconductor chip CHP3 includes an upper inductor 100 and an upper inductor 200 both being surrounded by the seal ring SR. Here, the upper inductor 100 has a tap-pad 1*a*, a spiral wiring 1*b* connected to the tap-pad 1*a*, and a trans-pad 1*c* connected to the spiral wiring 1*b*. Similarly, the upper inductor 200 has a tap-pad 2*a*, a spiral wiring 2*b* connected to the tap-pad 2*a*, and a trans-pad 2*c* connected to the spiral wiring 2*b*.

Further, in plan view, the semiconductor chip CHP3 includes a tap-pad 3*a*, a trans-pad 3*c*, a tap-pad 4*a*, and a trans-pad 4*c* all being surrounded by the seal ring SR. The tap-pad 3*a* and the trans-pad 3*c* act as a tap-pad and a trans-pad of a lower inductor (not shown) formed below the upper inductor 100. That is, the lower inductor that is paired with the upper inductor 100 is formed below the upper inductor 100, and the tap-pad 3*a* and the trans-pad 3*c* drawn from the lower inductor via wiring are formed in the same layer as the upper inductor 100.

Similarly, the tap-pad 4*a* and the trans-pad 4*c* act as a tap-pad and a trans-pad of a lower inductor (not shown) formed below the upper inductor 200. That is, the lower inductor that is paired with the upper inductor 200 is formed below the upper inductor 200, and the tap-pad 4*a* and the trans-pad 4*c* drawn from the lower inductor via wiring are formed in the same layer as the upper inductor 200.

Here, for example, a high-side reference potential of about 800 V is applied to the upper inductor 100 and the upper inductor 200. On the other hand, a low-side reference potential of about 0 V is applied to the lower inductor (the tap-pad 3*a* and the trans-pad 3*c*) and the lower inductor (the tap-pad 4*a* and the trans-pad 4*c*). That is, a reference potential different from the reference potential applied to the upper inductor 100 is applied to the lower inductor that is paired with the upper inductor 100. Similarly, a low-side reference potential different from the high-side reference potential applied to the upper inductor 200 is applied to the lower inductor paired with the upper inductor 200.

Cross-Sectional Structure of Semiconductor Chip

Next, the cross-sectional structure of the semiconductor chip CHP3 is explained.

Figure 6:
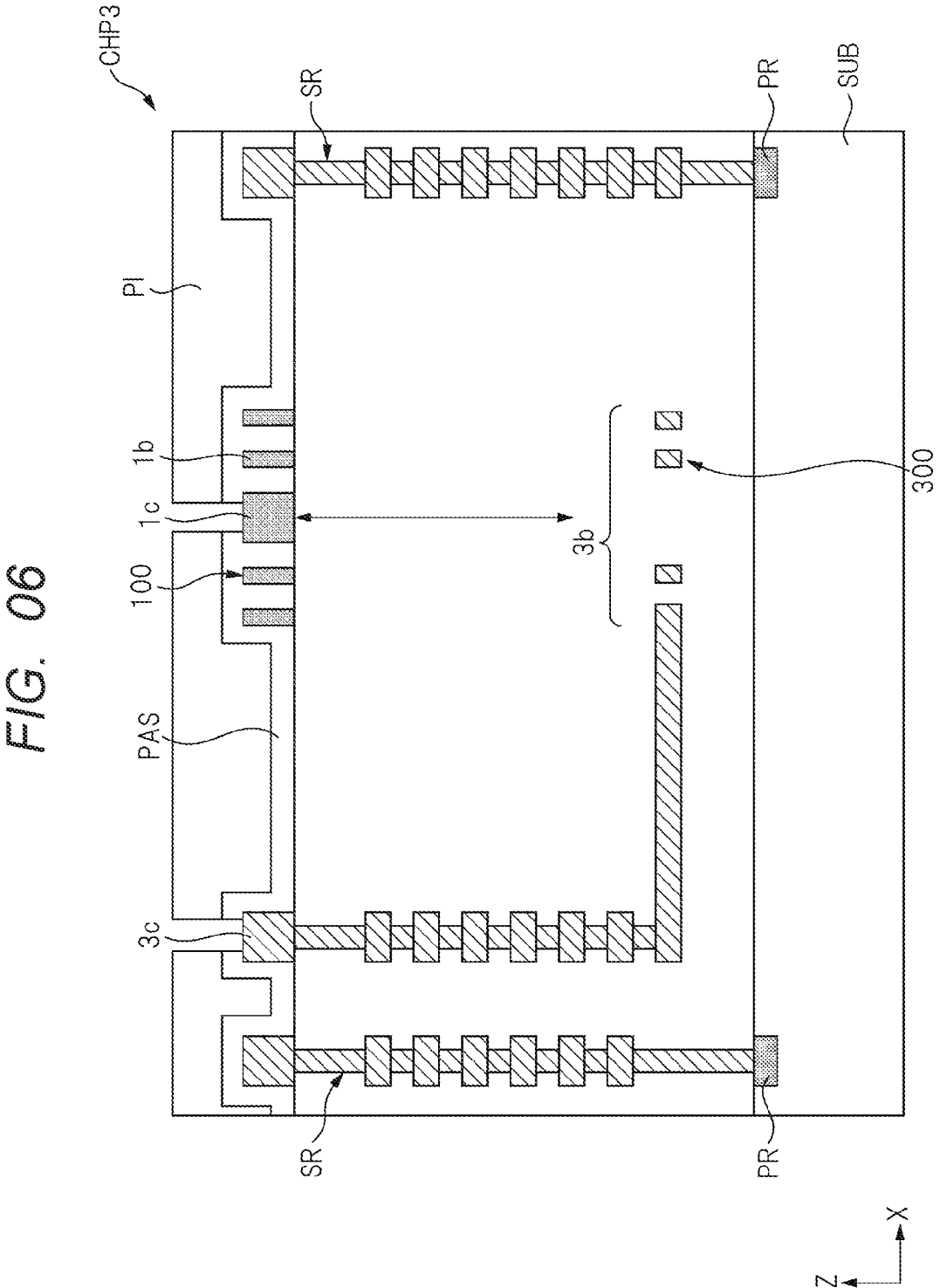
FIG. 6 is a cross-sectional view along A-A line of FIG. 5.

FIG. 6 is a cross-sectional view of the semiconductor chip CHP3 along A-A line of FIG. 5.

In FIG. 6, the semiconductor chip CHP3 includes a p-type semiconductor substrate SUB, a p-type semiconductor region PR, a wiring layer, a lower inductor 300, the trans-pad 3*c*, and the upper inductor 100. For example, the p-type semiconductor region PR having an impurity concentration higher than that of the p-type semiconductor substrate SUB is formed on a surface of the p-type semiconductor substrate SUB. The wiring layer including a plurality of wiring layers is formed on the p-type semiconductor region PR. The plurality of wiring layers includes seal ring SR and the lower inductor 300. The lower inductor 300 includes a spiral wiring 3*b*. A wiring formed in the plurality of wiring layers is drawn from the lower inductor 300 (spiral wiring 3*b*), and the spiral wiring 3*b* is electrically connected to the trans-pad 3*c* formed in an uppermost layer of the plurality of wiring layers. That is, the lower inductor 300 is electrically connected to the trans-pad 3*c* and the tap-pad (not shown) via the wiring formed in the plurality of wiring layers. Further, the upper inductor 100 is formed on the wiring layer. That is, the upper inductor 100 is formed so as to overlap with the lower inductor 300, and the upper inductor 100 has the spiral wiring 1*b* and the trans-pad 1*c*.

The semiconductor chip CHP3 further includes a surface protective film PAS and a polyimide resin film PI. The protective film PAS and the polyimide resin film PI are formed so as to cover the upper inductor 100. The surface protective film PAS and the polyimide resin film PI include openings exposing a part of the surface of the trans-pad 3*c* and a part of the surface of the trans-pad 1*c* therefrom. The surface protective film PAS is formed of a silicon oxide film and a silicon nitride film. The semiconductor chip CHP3 is configured as described above.

Consideration for Improvement

For example, in a transformer, it is desired to improve the breakdown voltage (galvanic breakdown voltage) so as to enable non-contact signal transmission between circuits having different potentials.

In this regard, in the related art, a transformer and a transistor are formed on one semiconductor chip as in a two-chip configuration, and therefore, the transformer is formed using a normal CMOS technique related to the transistor.

Specifically, in the normal CMOS technique, a transistor is formed in a semiconductor substrate, and a wiring layer including a plurality of wiring layers is formed above the transistor. Here, in the normal CMOS technique, the lower wiring provided in the lower wiring layer connects adjacent transistors, and has a short connecting length. For this reason, in the lower wiring, the parasitic resistances need not be considered as much, so that the lower wiring is formed of a local wiring having a small wiring width and a small wiring thickness.

On the other hand, in the normal CMOS technique, the upper wiring provided in the upper wiring layer connects circuits separated from each other by a distance, and the connection length thereof is increased. Consequently, in the upper wiring, the parasitic resistances need to be considered, so that the upper wiring is formed of a global wiring with a large wiring width and a large wiring thickness. As described above, in the wiring layer formed of the plurality of wiring layers in the normal CMOS technique, a fine local wiring is formed in the lower wiring layer while a wiring having a larger wiring width and a larger wiring thickness is formed in the upper wiring layer. In the layers above the lower wiring layer, the closer the layer is disposed to the upper wiring layer, the greater the wiring width and the wiring thickness of the wiring formed in the layer will be. That is, in the normal CMOS technique, the wiring provided in the wiring layer formed of the plurality of wiring layers is formed of a local wiring provided in the lower wiring layer, a semi-global wiring provided in the middle wiring layer, and a global wiring provided in the upper wiring layer.

When the transformer is formed on the premise of such a normal CMOS technique, the lower inductor, which is a component of the transformer, is formed using the local wiring provided in the lower wiring layer. On the other hand, the upper inductor, which is a component of the transformer, is formed using the global wiring provided in the upper wiring layer. As a result, an enough distance can be secured between the lower inductor and the upper inductor (the distance in the thickness direction of the semiconductor chip), so that the breakdown voltage of the transformer can be secured. However, in recent years, it has been desired to further improve the breakdown voltage of the transformer, and a device for improving the breakdown voltage of the transformer is required.

In this regard, an interlayer insulating film is formed between the plurality of wiring layers. The thickness of the interlayer insulating film for the lower wiring layer corresponds to the local wiring and becomes smaller than the thickness of the interlayer insulating film for the upper wiring layer. On the other hand, the thickness of the interlayer insulating film for the upper wiring layer corresponds to the global wiring and becomes larger than the thickness of the interlayer insulating film for the lower wiring layer.

Here, for example, in order to improve the breakdown voltage of the transformer, it is conceivable to increase the distance between the lower inductor and the upper inductor. For example, in order to increase the distance between the lower inductor and the upper inductor, it is conceivable to increase the thickness of the interlayer insulating film. When considering to increase the thickness of the interlayer insulating film while minimizing the modifications in designing the wiring layers in the normal CMOS technique, it is natural to increase the thickness of the uppermost interlayer insulating film. This is because, when the thickness of an interlayer insulating film disposed below the uppermost interlayer insulating film changes, the positions of all of the wiring layers disposed above the interlayer insulating film changes. As a result, not only are the wiring layers in the normal CMOS technique change significantly, but also the thicknesses of the interlayer insulating films increase as the positions of the interlayer insulating film becomes closer to the uppermost interlayer insulating film further resulting in a failure in minimizing the design change in the normal CMOS technique.

Therefore, in order to increase the distance between the lower inductor and the upper inductor while minimizing the design change of wiring structure formed by the normal CMOS technique on the premise of the normal CMOS technique, the thickness of the uppermost interlayer insulating film needs to be increased.

However, the thickness of the uppermost interlayer insulating film corresponds to the global wiring, and thus, the thickness of the uppermost interlayer insulating film is originally larger than the thickness of the lower interlayer insulating film. Therefore, when the thickness of the uppermost interlayer insulating film is further increased to further improve the breakdown voltage of the transformer, the thickness of the uppermost interlayer insulating layer is greatly increased. This means that the film stress caused by the interlayer insulating film increases, and the "warpage" generated in the semiconductor wafer increases. When the "warpage" generated in the semiconductor wafer increases, handling of the semiconductor wafer at the time of transfer becomes difficult. For this reason, when considering an increase in the "warpage" of the semiconductor wafer, further increasing the thickness of the uppermost interlayer insulating film as a measure of increasing the breakdown voltage of the transformer is difficult.

As described above, in the technique of forming the transformer using the normal CMOS technique, improving the breakdown voltage of the transformer while suppressing the "warpage" of the semiconductor wafer is difficult. In other words, in the manufacturing technique of the transformer on the premise of the normal CMOS technique, when the breakdown voltage of the transformer is further improved, the phenomena that the "warpage" of the semiconductor wafer increases become apparent. Therefore, a technique for improving the breakdown voltage of the transformer while suppressing "warpage" of the semiconductor wafer is desired.

Further, in the technique of forming the transformer using the normal CMOS technique, the following room for improvement becomes apparent and will be described.

For example, in the normal CMOS technique, the lower wiring is formed of the local wiring, while the upper wiring is formed of the global wiring. The normal CMOS technique is based on the parasitic resistance of the lower wiring connecting the adjacent transistors does not need to be considered as much, while the parasitic resistance of the upper wiring connecting the circuits separated from each other needs to be considered more than that of the lower wiring.

In this regard, in the technique of forming the transformer using the normal CMOS technique, the lower inductor is formed in the lower wiring layer. However, since a large current flows through the lower inductor, the influence of the parasitic resistance in the lower wiring layer is large. Specifically, when the lower inductor is formed in the lower wiring layer, the lower inductor has a high resistance, and consequently, the signal amplitude of the signal that is transmitted in the lower inductor deteriorates due to the high parasitic resistance. In other words, in the technique of forming the transformer using the normal CMOS technique, there is room for improvement from the viewpoint of improving quality of signal transmitted in the lower inductor.

This is because since the normal CMOS technique for designing the lower wiring does not consider the parasitic resistance as much, the lower resistance required in designing the lower inductor for improving the signal-quality is not considered in the normal standard CMOS technique for the lower layer wiring. In other words, although designing the lower inductor differs from designing the lower wiring in the normal CMOS technique, there is room for improving the deterioration of the signal amplitude of the signal transmitted in the lower inductor due to the provision of the lower inductor in the lower wiring layer.

As described above, in the technique of manufacturing the transformer using the normal CMOS technique, not only is it difficult to improve the breakdown voltage of the transformer while suppressing the "warpage" of the semiconductor wafer, but also the signal amplitude of the signal that is transmitted in the lower inductor deteriorates. That is, in the technique of manufacturing the transformer using the normal CMOS technique, there is room for improvement from a viewpoint of suppressing the "warpage" of the semiconductor wafer, improving the dielectric breakdown voltage of the transformer, and improving the quality of the signal transmitted in the lower inductor.

Therefore, the present embodiment provides techniques to overcome the above-described room for improvement. Hereinafter, the technical idea in the present embodiment will be described.

Basic Concept in Embodiment

The above-described room for improvement is considered to be an essential factor in forming the transformer using the normal CMOS technique. In this regard, in the two-chip configuration, there is a need to form the transformer using the normal CMOS techniques since transistors are formed with the transformer. On the other hand, in the three-chip configuration, only the transformer is formed without forming the transistor. Therefore, there is no need to use the normal CMOS technique in forming the transformer.

Therefore, the present embodiment allows for suppression of warpage of the semiconductor wafer, further improvement of the breakdown voltage of the transformer, and improvement in the quality of signal transmitted in the lower inductor without being limited to the normal CMOS technique. That is, assuming that there is an essential factor of the above-described room for improvement in forming the transformer using the normal CMOS technique, the present embodiment adopts a novel and free design concept different from the design concept of the normal CMOS technique. According to this basic concept, it is possible to achieve the suppression of "warpage" of the semiconductor wafer, the improvement of the breakdown voltage of the transformer, and the improvement of the quality of signal that is transmitted in the transformer. Hereinafter, a concrete description will be given.

Cross-Sectional Structure of Semiconductor Chip in Embodiment

Figure 7:
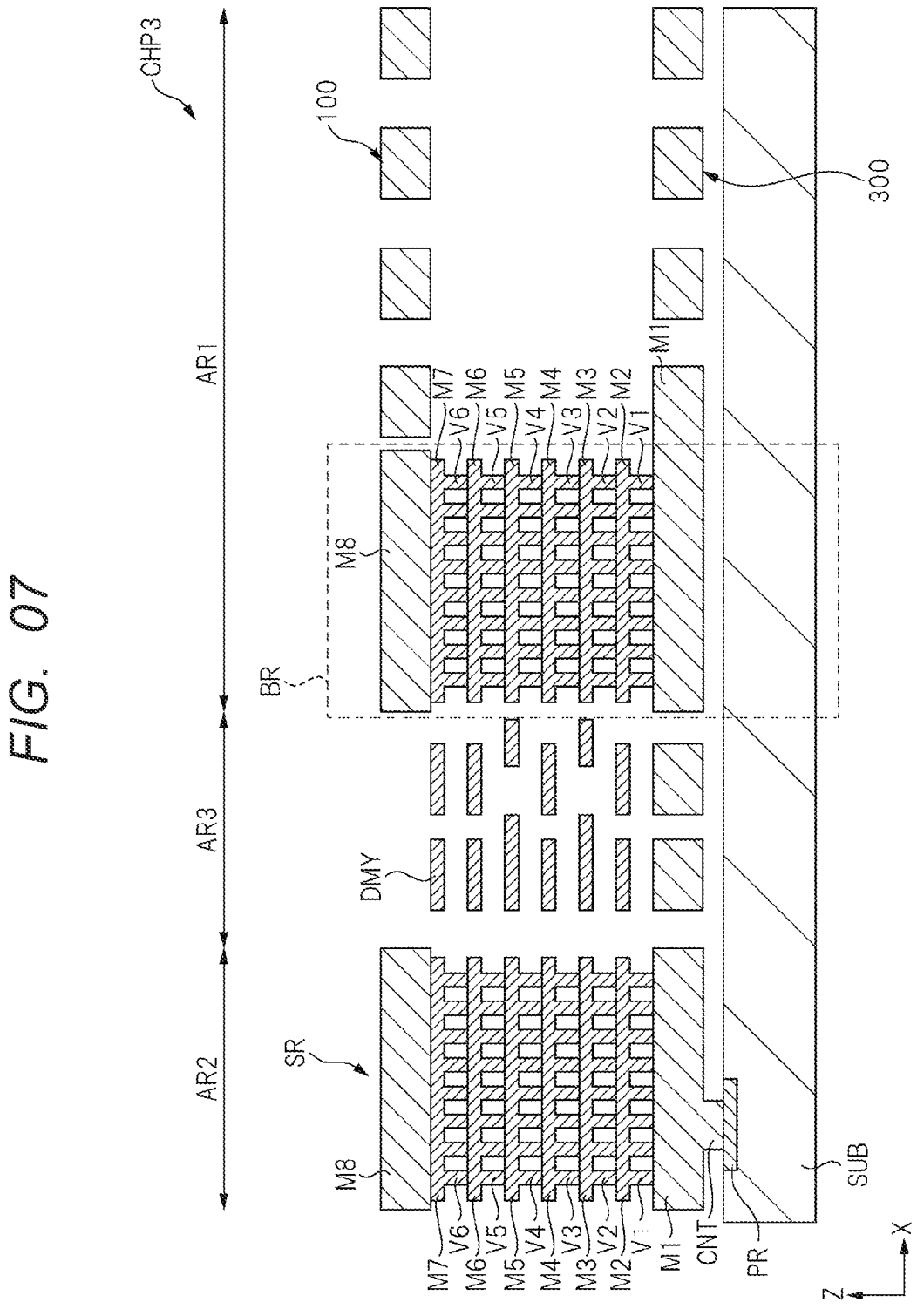
FIG. 7 is a diagram showing a cross-sectional structure of the semiconductor chip according to an embodiment.

FIG. 7 is a diagram showing a cross-sectional structure of the semiconductor chip CHP3 in the present embodiment. In particular, FIG. 7 is an enlarged cross-sectional view of the semiconductor chip CHP3 taken along A-A line of FIG. 5.

In FIG. 7, the semiconductor chip CHP3 includes a transformer forming region AR1, a seal ring forming region AR2, and an intermediate region AR3. The transformer forming region AR1 includes the transformer. The seal ring forming region AR2 includes the seal ring SR (also referred to as a guard ring). The intermediate region AR3 is sandwiched between the transformer forming region AR1 and the seal ring forming region AR2, and includes, for example, a dummy wiring DMY. Note that the interlayer insulating film is not shown in FIG. 7.

The semiconductor chip CHP3 has the p-type semiconductor substrate SUB, the p-type semiconductor region PR formed on the surface of the p-type semiconductor substrate SUB, and wiring layer formed on the p-type semiconductor region PR. The p-type semiconductor region PR has an impurity concentration higher than that of the p-type semiconductor substrate SUB. The wiring layer is formed of the plurality of wiring layers.

The plurality of wiring layers of the wiring layer includes, for example, a first wiring layer, a second wiring layer, a third wiring layer, a fourth wiring layer, a fifth wiring layer, a sixth wiring layer, a seventh wiring layer, and an eighth wiring layer which are listed in the order of being closest to the p-type semiconductor substrate SUB. In the present specification, the first wiring layer is referred to as a "lower wiring layer". The second wiring layer, the third wiring layer, the fourth wiring layer, the fifth wiring layer, the sixth wiring layer, and the seventh wiring layer are collectively referred to as a "multilayer wiring layer". The eighth wiring layer is referred to as an "upper wiring layer".

The case where the number of wiring layers in the plurality of wiring layers is eight will be explained hereinafter, but the number of wiring layers in the plurality of wiring layers is not limited to eight. For example, when wiring layers are six layers, the first wiring layer is referred to as the "lower wiring layer", the second wiring layer to the fifth wiring layer are referred to as the "multilayer wiring layer", and the sixth wiring layer is referred to as the "upper wiring layer". In addition, as long as the dielectric breakdown voltage between the inductors is ensured, the "lower wiring layer" in which the lower inductors are provided is not limited to the first wiring layer, and may be, for example, the second wiring layer.

In FIG. 7, the transformer forming region AR1 includes the upper inductor 100 and the lower inductor 300 which are components of the transformer. In this case, the upper inductor 100 is provided in the "upper wiring layer", while the lower inductor 300 is provided in the "lower wiring layer". Further, as shown in FIG. 7, the transformer forming region AR1 includes a wiring lead-out structure BR from the lower inductor 300.

The wiring lead-out structure BR includes: a first layer wiring M1 provided in the "lower wiring layer"; a second layer wiring M2 provided in the second wiring layer; a third layer wiring M3 provided in the third wiring layer; a fourth layer wiring M4 provided in the fourth wiring layer; a fifth layer wiring M5 provided in the fifth wiring layer; a sixth layer wiring M6 provided in the sixth wiring layer; a seventh layer wiring M7 provided in the seventh wiring layer; and an eighth layer wiring M8 provided in the "upper wiring layer".

Here, the first layer wiring M1 is connected to the p-type semiconductor substrate SUB via a contact via-plug CNT, and is electrically connected to the second layer wiring M2 via a via-plug V1. The second layer wiring M2 is electrically connected to the third layer wiring M3 via a via-plug V2. The third layer wiring M3 is electrically connected to the fourth layer wiring M4 via a via-plug V3. The fourth layer wiring M4 is electrically connected to the fifth layer wiring M5 via a via-plug V4. The fifth layer wiring M5 is electrically connected to the sixth layer wiring M6 via a via-plug V5. The sixth layer wiring M6 is electrically connected to the seventh layer wiring M7 via a via-plug V6. The seventh layer wiring M7 contacts the eighth layer wiring M8. That is, the seventh layer wiring M7 is provided in the seventh wiring layer that is one layer below the "upper wiring layer", and the seventh layer wiring M7 and the eighth layer wiring M8 are provided so as to be in contact with each other.

As described above, the first layer wiring M1 provided in the "lower wiring layer", the second layer wiring M2 to the seventh layer wiring M7 provided in the "multilayer wiring", and the eighth layer wiring M8 provided in the "upper wiring layer", are electrically connected to each other. For example, a wiring that differs from the eighth layer wiring M8 is provided in the "upper wiring layer", and the upper inductor 100 is formed of the wiring. On the other hand, the lower inductor 300 is electrically connected to the first layer wiring M1. Accordingly, the upper inductor 100 and the lower inductor 300 are not electrically connected to each other. The lower inductor 300 is electrically connected to the first layer wiring M1 provided in the "lower wiring layer", the second layer wiring M2 to the seventh layer wiring M7 provided in the "multilayer wiring layer", and the eighth layer wiring M8 provided in the "upper wiring layer", and the eighth layer wiring M8 is connected to a first bonding wire configured to be applied with a first potential, for example. On the other hand, the wiring configuring the upper inductor 100 is connected to, for example, a second bonding wire configured to be applied with a second potential that differs from the first potential.

Figure 8:
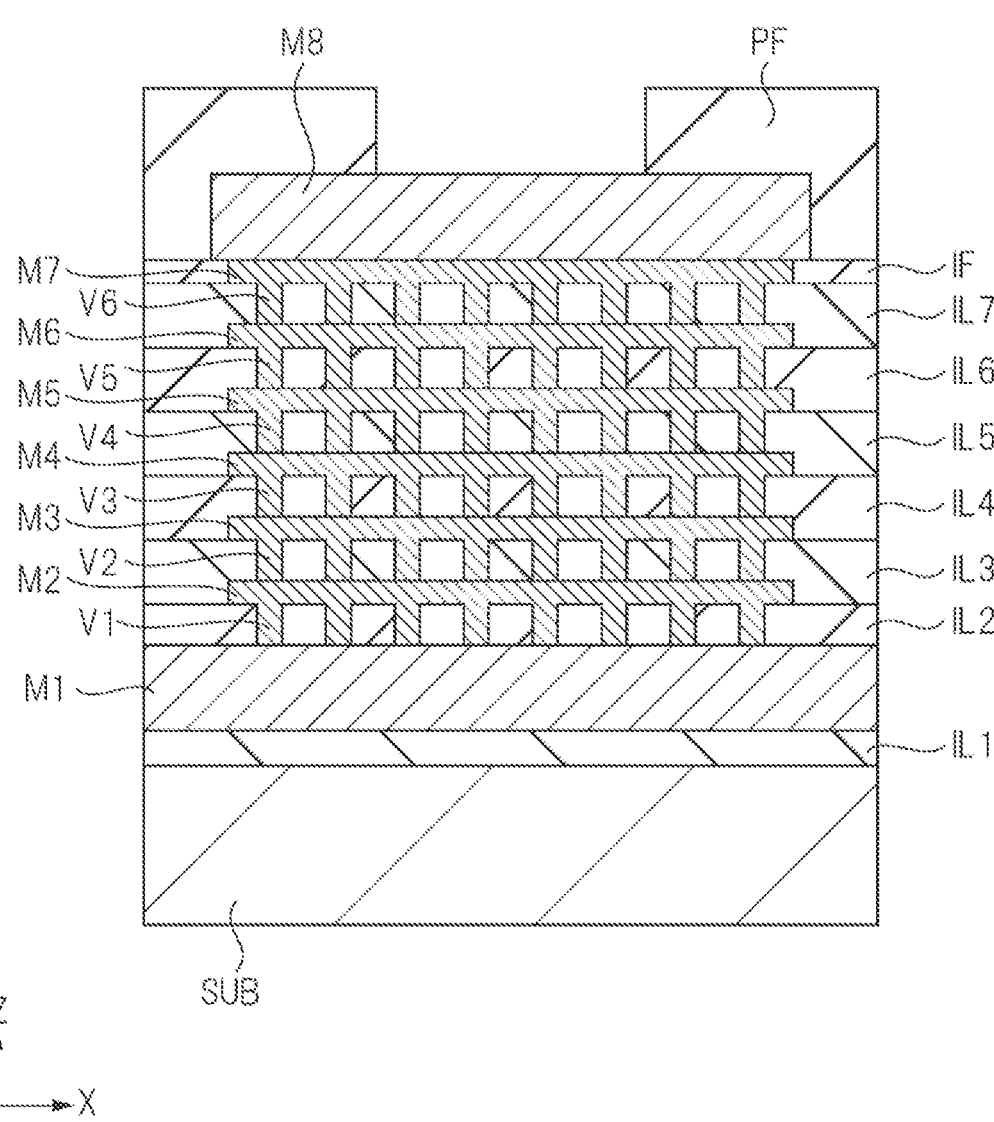
FIG. 8 is an enlarged view of a wiring extraction structure formed in a transformer forming region.

FIG. 8 is an enlarged view of the wiring lead-out structure BR formed in the transformer forming region AR1. In FIG. 8, the wiring lead-out structure BR includes a first interlayer insulating film IL1, a second interlayer insulating film IL2, a third interlayer insulating film IL3, a fourth interlayer insulating film IL4, fifth interlayer insulating film IL5, a sixth interlayer insulating film IL6, a seventh interlayer insulating film IL7, an insulating film IF, and a protective film PF. The first interlayer insulating film IL1 is provided between the p-type semiconductor substrate SUB and the first layer wiring M1. Further, the second interlayer insulating film IL2 is provided between the first layer wiring M1 and the second layer wiring M2, and includes the via-plug V1 for electrically connecting the first layer wiring M1 and the second layer wiring M2 so as to penetrate the second interlayer insulating film IL2. Further, the third interlayer insulating film IL3 is provided between the second layer wiring M2 and the third layer wiring M3, and includes the via-plug V2 for electrically connecting the second layer wiring M2 and the third layer wiring M3 so as to penetrate the third interlayer insulating film IL3. Similarly, the fourth interlayer insulating film IL4 is provided between the third layer wiring M3 and the fourth layer wiring M4, and includes the via-plug V3 for electrically connecting the third layer wiring M3 and the fourth layer wiring M4 so as to penetrate the fourth interlayer insulating film IL4.

The fifth interlayer insulating film IL5 is provided between the fourth layer wiring M4 and the fifth layer wiring M5, and includes the via-plug V4 for electrically connecting the fourth layer wiring M4 and the fifth layer wiring M5 so as to penetrate the fifth interlayer insulating film IL5. Further, the sixth interlayer insulating film IL6 is provided between the fifth layer wiring M5 and the sixth layer wiring M6, and includes the via-plug V5 for electrically connecting the fifth layer wiring M5 and the sixth layer wiring M6 so as to penetrate the sixth interlayer insulating film IL6. Similarly, the seventh interlayer insulating film IL7 is provided between the sixth layer wiring M6 and the seventh layer wiring M7, and includes the via-plug V6 for electrically connecting the sixth layer wiring M6 and the seventh layer wiring M7 so as to penetrate the seventh interlayer insulating film IL7. The eighth layer wiring M8 and the insulating film IF are formed on the seventh layer wiring M7. The protective film PF is formed on the eighth layer wiring M8 and the insulating film IF. The protective film PF has an opening, and a part of the eighth layer wiring M8 is exposed from the opening of the protective film PF. The protective film PF is formed of, for example, a laminated film of a surface protective film and a polyimide resin film. The surface protective film is formed of, for example, a silicon oxide film and a silicon nitride film.

Here, in FIG. 8, the thickness of the first layer wiring M1 provided in the "lower wiring layer" (thickness in the Z-direction) is larger than the thickness of wiring (second layer wiring M2 to seventh layer wiring M7) provided in each of the "multilayer wiring layer". Similarly, the thickness of the eighth layer wiring M8 provided in the "upper wiring layer" (thickness in the Z-direction) is larger than the thickness of wiring provided in each of the "multilayer wiring layer".

Consequently, a resistance value of the first layer wiring M1 becomes lower than a resistance value of each of the second layer wiring M2 to the seventh layer wiring M7. Similarly, a resistance value of the eighth layer wiring M8 becomes lower than the resistance value of each of the second layer wiring M2 to the seventh layer wiring M7.

In addition, the film stress (compressive stress or tensile stress) of wiring (second layer wiring M2 to seventh layer wiring M7) provided in each of the "multilayer wiring layer" is larger than the film stress of the first layer wiring M1 or the film stress of the eighth layer wiring M8. The film stresses of the second layer wiring M2 to the seventh layer wiring M7 have reverse characteristics to the film stress of the interlayer insulating film (the first interlayer insulating film IL1 to the seventh interlayer insulating film IL7). Specifically, for example, when the film stresses of the first interlayer insulating film IL1 to the seventh interlayer insulating film IL7 are "compressive stresses", the film stresses of the second layer wiring M2 to the seventh layer wiring M7 are "tensile stresses". Conversely, when the film stresses of the first interlayer insulating film IL1 to the seventh interlayer insulating film IL7 are "tensile stresses", the film stresses of the second layer wiring M2 to the seventh layer wiring M7 are "compressive stresses".

The "multilayer wiring layer" includes, for example, the second wiring layer, the third wiring layer formed one layer above the second wiring layer, and the fourth wiring layer formed one layer above the third wiring layer. The semi-conductor chip CHP3 includes the second layer wiring M2 provided in the second wiring layer, the third layer wiring M3 provided in the third wiring layer, and the fourth layer wiring M4 provided in the fourth wiring layer. In this case, the second layer wiring M2 is connected to the third layer wiring M3 via the via-plug V2, and the third layer wiring M3 is connected to the fourth layer wiring M4 via the via-plug V3. In plan view, the via-plug V2 and the via-plug V3 are disposed so as to overlap with each other.

Returning to FIG. 7, the seal ring forming region AR2 includes the seal ring SR. In this case, the seal ring SR includes the first layer wiring M1 provided in the "lower wiring layer", the second layer wiring M2 provided in the second wiring layer of the "multi-layer wiring layer", the third layer wiring M3 provided in the third wiring layer, the fourth layer wiring M4 provided in the fourth wiring layer, the fifth layer wiring M5 provided in the fifth wiring layer, the sixth layer wiring M6 provided in the sixth wiring layer, the seventh layer wiring M7 provided in the seventh wiring layer, and the eighth layer wiring M8 provided in the "upper wiring layer".

Here, the first layer wiring M1 is connected to the p-type semiconductor region PR via the contact via-plug CNT, and is electrically connected to the second layer wiring M2 via the via-plug V1. The second layer wiring M2 is electrically connected to the third layer wiring M3 via the via-plug V2. The third layer wiring M3 is electrically connected to the fourth layer wiring M4 via the via-plug V3. The fourth layer wiring M4 is electrically connected to the fifth layer wiring M5 via the via-plug V4. The fifth layer wiring M5 is electrically connected to the sixth layer wiring M6 via the via-plug V5. Further, the sixth layer wiring M6 is electrically connected to the seventh layer wiring M7 via the via-plug V6. The seventh layer wiring M7 contacts the eighth layer wiring M8. That is, the seventh layer wiring M7 is provided in the seventh wiring layer that is one layer below the "upper wiring layer", and the seventh layer wiring M7 and the eighth layer wiring M8 are provided so as to be in contact with each other.

Next, in FIG. 7, the intermediate region AR3 includes the dummy wiring DMY. The dummy wiring DMY is provided in each of the "lower wiring layer" and the "multilayer wiring layer".

Here, in FIG. 7, the contact via-plug CNT is made of aluminum. Further, the first layer wiring M1 and the lower inductor 300 provided in the "lower wiring layer" are made of aluminum. Similarly, the eighth layer wiring M8 and the upper inductor 100 provided in the "upper wiring layer" are also made of aluminum.

On the other hand, each of the second layer wiring M2 to the seventh layer wiring M7 and the dummy wiring DMY provided in the "multilayer wiring layer" are made of tungsten. Similarly, each of the via-plug V1 to the via-plug V6 is made of tungsten.

In FIG. 8, each of the first interlayer insulating film IL1 to the seventh interlayer insulating film IL7 is formed of, for example, a silicon oxide film.

The semiconductor chip CHP3 is configured as described above.

Structural Features in Embodiment

Next, the structural features in the present embodiment will be described.

The first feature in the present embodiment is to provide the wiring in the "lower wiring layer" and the wiring in the "upper wiring layer" that are thicker than each wiring provided in the "multilayer wiring layer".

Specifically, as shown in FIG. 7, the first feature is that the thickness (thickness in the Z-direction) of the first layer wiring M1 provided in the "lower wiring layer" and the thickness (thickness in the Z-direction) of the eighth layer wiring M8 provided in the "upper wiring layer" are larger than the respective thicknesses (thicknesses in the Z-direction) of the second layer wiring M2 to the seventh layer wiring M7 provided in the "multilayer wiring layer".

As a result, as shown in FIG. 7, the thickness (thickness in the Z-direction) of the lower inductor 300 provided in the "lower wiring layer" becomes as large as the thickness of the first layer wiring M1. Similarly, the thickness (thickness in the Z-direction) of the upper inductor 100 provided in the "upper wiring layer" becomes as large as the thickness of the eighth layer wiring M8. As a result, the parasitic resistance can be reduced in both the upper inductor 100 and the lower inductor 300. Therefore, according to the first feature, it is possible to suppress the deterioration of the signal amplitude of the signal transmitted through the upper inductor 100 and to suppress the deterioration of the signal amplitude of the signal transmitted through the lower inductor 300.

As described above, in the present embodiment, unlike the normal CMOS technique in which a local wiring having a large parasitic resistance is provided in the "lower wiring layer", the present embodiment provides a wiring having low parasitic resistance being disposed in the "lower wiring layer" to realize a configuration in which the lower-inductor 300 having low resistance is disposed in the "lower wiring layer". In the present embodiment, the thickness of wiring provided in the "lower wiring layer" is made larger than the thickness of the respective wiring provided in the "multilayer wiring layer" above the "lower wiring layer", which is not considered in the normal CMOS technique. Thus, according to the present embodiment, when the lower inductor 300 is provided in the "lower wiring layer", the thickness of the lower inductor 300 can be increased, and consequently, the parasitic resistance of the lower inductor 300 can be reduced.

On the other hand, in order to realize a configuration in which the upper inductor 100 having low resistance is disposed in the "upper wiring layer", the thickness of wiring provided in the "upper wiring layer" is made larger than the thickness of each wiring provided in the "multilayer wiring layer" disposed below the "upper wiring layer" in accordance with the normal CMOS technique of providing a global wiring having low parasitic resistance in the "upper wiring layer". Thus, according to the present embodiment, when the upper inductor 100 is provided in the "upper wiring layer", the thickness of the upper inductor 100 can be increased, so that the parasitic resistance of the upper inductor 100 can be reduced.

For this reason, the present embodiment provides for a novel design concept in which a thick wiring is provided in both the "lower wiring layer" and the "upper wiring layer", while a thin wiring is provided in the "multilayer wiring layer" located between the "lower wiring layer" and the "upper wiring layer". The novel design concept can be realized by the "three-chip configuration" in which transistors are not formed on a semiconductor chip. According to the first feature, both the attenuation of the signal amplitude caused by the parasitic resistance of the lower inductor 300 and the attenuation of the signal amplitude caused by the parasitic resistance of the upper inductor 100 can be suppressed, so that the performance of the transformer can be improved.

Next, the second feature of the present embodiment provides for the thicknesses of the plurality of interlayer insulating films interposed between the wiring provided in the "lower wiring layer" and the wiring provided in the "upper wiring layer" being substantially uniform. Specifically, the second feature is, for example, as shown in FIG. 8, that the thickness of each of the second interlayer insulating film IL2 to the seventh interlayer insulating film IL7 interposed between the first layer wiring M1 provided in the "lower wiring layer" and the eighth layer wiring M8 provided in the "upper wiring layer" is approximately equal to each other. Note that the case where the thicknesses of wirings provided in the multilayer wiring layer are the same includes cases where the designed values (set values) of the thicknesses are the same and the thicknesses are slightly different from each other due to manufacturing variations.

Here, when the lower inductor 300 is provided in the "lower wiring layer" and the upper inductor 100 is provided in the "upper wiring layer", the second interlayer insulating film IL2 to the seventh interlayer insulating film IL7 are interposed between the lower inductor 300 and the upper inductor 100. According to the second feature in the present embodiment, when the distance between the lower inductor 300 and the upper inductor 100 is increased in order to improve the breakdown voltage of the transformer, the increase in the distance between the lower inductor 300 and the upper inductor 100 is realized by unfirmly increasing the thickness of each of the second interlayer insulating film IL2 to the seventh interlayer insulating film IL7. That is, according to the second feature, the increase in the distance between the lower inductor 300 and the upper inductor 100 is dispersed by unfirmly increasing the thickness of each of the second interlayer insulating film IL2 to the seventh interlayer insulating film IL7. As a result, the thickness of each of the second interlayer insulating film IL2 to the seventh interlayer insulating film IL7 does not become excessively large, so that "warpage" of the semiconductor wafer caused by the film stresses of the interlayer insulating films having excessively large thicknesses can be suppressed. That is, according to the second feature, it is possible to achieve both suppression of "warpage" of the semiconductor wafer and further improvement of the breakdown voltage of the transformer. In other words, according to the second feature, it is possible to further improve the breakdown voltage of the transformer while suppressing "warpage" of the semiconductor wafer.

For example, in the normal CMOS technique, the thicknesses of the plurality of interlayer insulating films interposed between the wiring provided in the "lower wiring layer" and the wiring provided in the "upper wiring layer" are different from each other. When the distance between the lower inductor 300 and the upper inductor 100 is increased in order to improve the breakdown voltage of the transformer, the thickness of the thickest interlayer insulating film is further increased to increase the distance between the lower inductor 300 and the upper inductor 100 in view of maintaining the design concept of the normal CMOS technique. In the normal CMOS technique, the increase in the film stress of the thickest interlayer insulating film results in the "warpage" to occur in the semiconductor wafer.

On the other hand, the present embodiment forms interlayer insulating films such that the thicknesses of the plurality of interlayer insulating films interposed between the wiring provided in the "lower wiring layer" and the wiring provided in the "upper wiring layer" are substantially uniform without adopting the normal CMOS technique. Thus, according to the second feature of the present embodiment, even when the distance between the lower inductor 300 and the upper inductor 100 is increased in order to improve the breakdown voltage of the transformer, it is possible to suppress an excessively large thickness of a particular interlayer insulating film. This means that the "warpage" of the semiconductor wafer caused by the film stress of the particular interlayer insulating film which is excessively thick can be suppressed. That is, according to the second feature, it is possible to improve the breakdown voltage of the transformer while suppressing "warpage" of the semiconductor wafer.

Further, in the present embodiment, each of the second layer wiring M2 to the seventh layer wiring M7 provided in the "multilayer wiring layer" is made of tungsten, while the first layer wiring M1 provided in the "lower wiring layer" and the eighth layer wiring M8 provided in the "upper wiring layer" are made of aluminum. Since the film stress of the film (wiring) made of tungsten is larger than the film stress of the film (wiring) made of aluminum, the film stress of each of the second layer wiring M2 to the seventh layer wiring M7 provided in the "multilayer wiring layer" is larger than the film stresses of the first layer wiring M1 provided in the "lower wiring layer" and the eighth layer wiring M8 provided in the "upper wiring layer". Since the film stress of wiring made of a metal has reverse characteristics to the film stress of the interlayer insulating film made of silicon oxide, the film stress of each of the second layer wiring M2 to the seventh layer wiring M7 provided in the "multilayer wiring layer" has reverse characteristics to the film stress of each of the second interlayer insulating film IL2 to the seventh interlayer insulating film IL7.

Thus, according to the present embodiment, for example, in FIG. 8, the total film stress obtained by combining the film stresses caused by the second interlayer insulating film IL2 to the seventh interlayer insulating film IL7 and the film stresses caused by the second layer wiring M2 to the seventh layer wiring M7 is reduced.

Therefore, according to the present embodiment, the "warpage" of the semiconductor wafer is suppressed by a synergistic factor of (1) the second feature that the thicknesses of the plurality of interlayer insulating films are substantially uniform, (2) the feature that the film stress of wiring provided in the "multilayer wiring layer" is larger than the film stresses of wiring provided in the "lower wiring layer" and wiring provided in the "upper wiring layer", and (3) the feature that the film stress of wiring provided in the "multilayer wiring layer" has reverse characteristics to the film stress of the interlayer insulating film. Therefore, the present embodiment provides for both suppression of "warpage" of the semiconductor wafer and further improvement of the breakdown voltage of the transformer.

It should be noted that the wiring lead-out structure BR shown in FIG. 7 efficiently suppresses the attenuation of the signal amplitude caused by the parasitic resistance of the wiring lead-out structure. In the wiring lead-out structure BR shown in FIG. 7, the via-plug V1 to the via-plug V6 are not directly stacked vertically, and the second layer wiring M2 to the seventh layer wiring M7 are interposed between two adjacent via-plugs in the via-plug V1 to the via-plug V6. This configuration of the wiring lead-out structure BR in FIG. 7 suppresses the higher resistivity caused by the positional deviation in the vertical stacking of the via-plug to the via-plug V6. That is, the wiring lead-out structure BR shown in FIG. 7 is effective in reducing the parasitic resistance when a current flows in the Z-direction resulting in suppression of the attenuation of the signal amplitude caused by the parasitic resistance. In particular, by setting the number of the via-plug V1 to the via-plug V6 to a large number (several thousand), it is possible to greatly reduce the parasitic resistance when a current flows in the Z-direction.

From the above, the present embodiment can realize all of (1) the suppression of the attenuation of the signal amplitude caused by the parasitic resistance of the lower inductor 300, (2) the suppression of the attenuation of the signal amplitude caused by the parasitic resistance of the upper inductor 100, and (3) the suppression of the attenuation of the signal amplitude caused by the parasitic resistance of the wiring lead-out structure BR. Therefore, the present embodiment provides improvement in the performance of the transformer.

Manufacturing Method of Semiconductor Chip

Next, the manufacturing method of the semiconductor chip in the present embodiment will be described.

Figure 9:
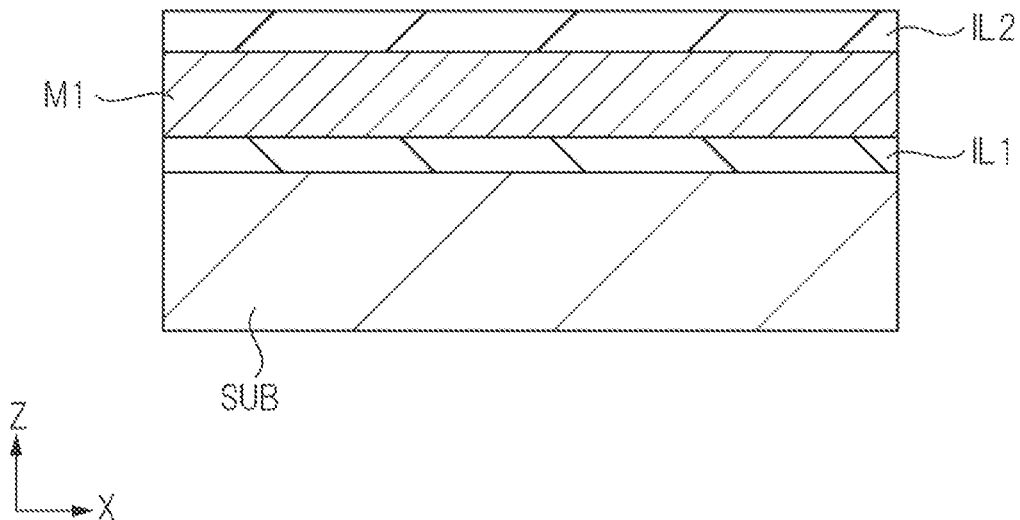
FIG. 9 is a cross-sectional view showing a manufacturing step of the semiconductor chip.

First, as shown in FIG. 9, the first interlayer insulating film IL1 is formed on the p-type semiconductor substrate SUB. The first interlayer insulating film IL1 is formed of, for example, a silicon oxide film, and can be formed by using, for example, a CVD (Chemical Vapor Deposition) method.

Subsequently, the first layer wiring M1 is formed on the first interlayer insulating film IL1, and the first layer wiring M1 is made of, for example, aluminum. The lower inductor not shown in FIG. 9 is formed in the same layer as the first layer wiring M1. Next, the second interlayer insulating film IL2 is formed on the first layer wiring M1, the second interlayer insulating film IL2 is formed of, for example, a silicon oxide film. Then, for example, the second interlayer insulating film IL2 is planarized by using a CMP (Chemical Mechanical Polishing) method.

Figure 10:
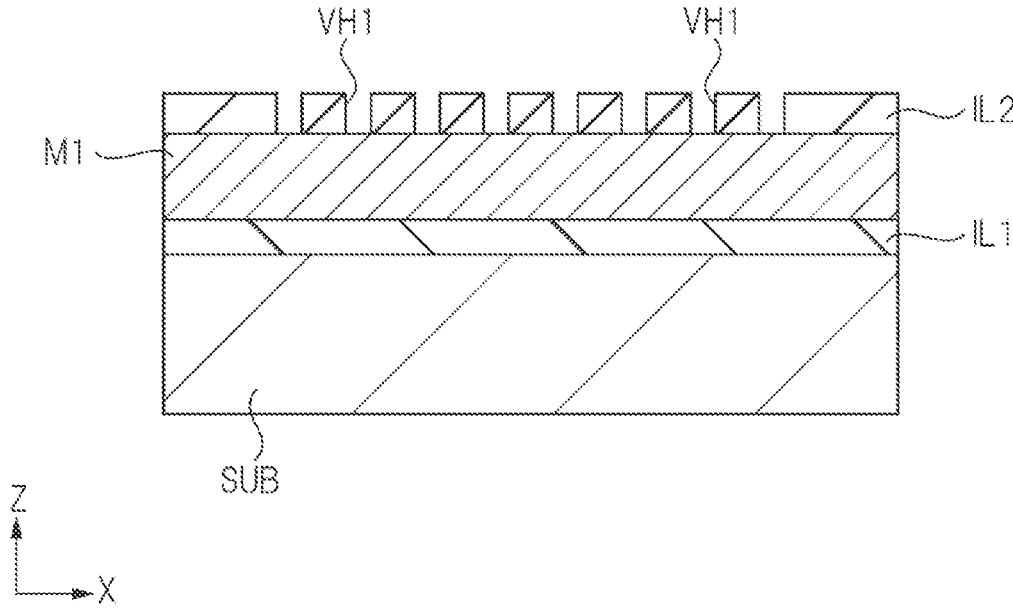
FIG. 10 is a cross-sectional view showing a manufacturing step of the semiconductor chip subsequent to FIG. 9.

Next, as shown in FIG. 10, a via-hole VH1 is formed in the second interlayer insulating film IL2 by using a photolithography technique and an etching technique. Here, the via-hole VH1 is formed so as to penetrate the second interlayer insulating film IL2 and reach the first layer wiring M1.

Figure 11:
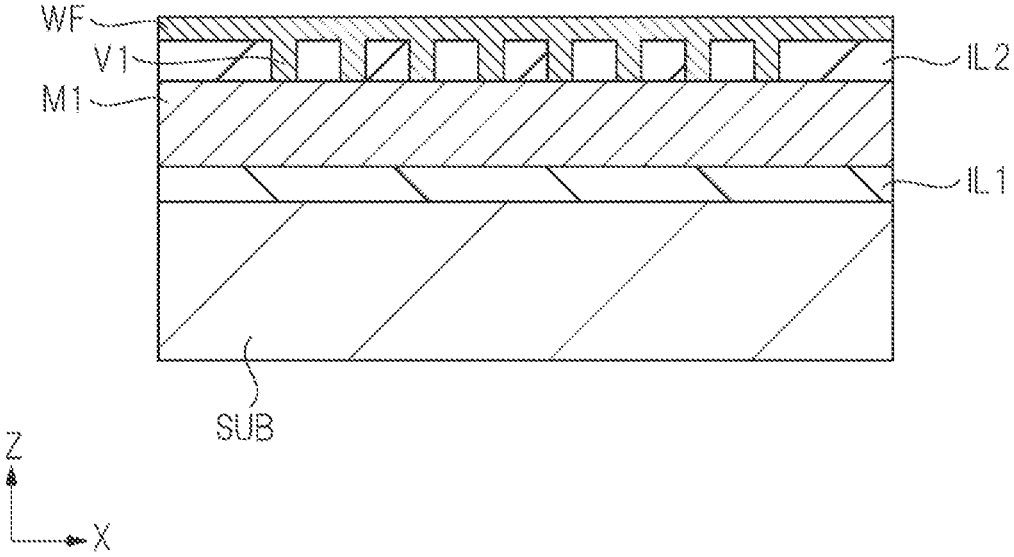
FIG. 11 is a cross-sectional view showing a manufacturing step of the semiconductor chip subsequent to FIG. 10.

Thereafter, as shown in FIG. 11, a tungsten film WF is formed on the second interlayer insulating film IL2 in which the via-hole VH1 is formed. At this time, the via-hole VH1 is filled with the tungsten film WF to form the via-plug V1. The tungsten film WF is formed so as to fill the vie-hole VH1 and cover the second interlayer insulating film IL2. The tungsten film WF is formed by using, for example, the CVD method.

Figure 12:
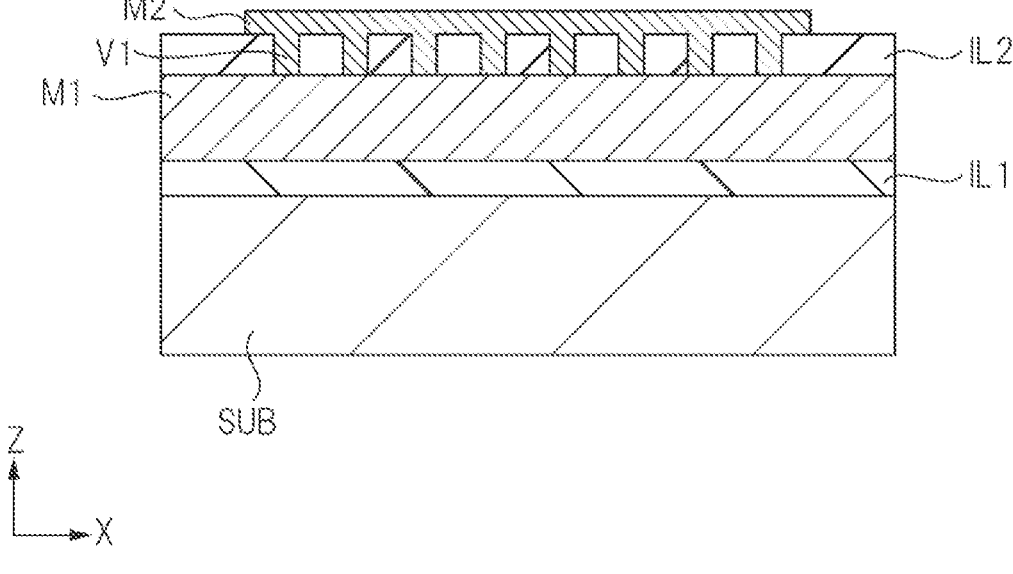
FIG. 12 is a cross-sectional view showing a manufacturing step of the semiconductor chip subsequent to FIG. 11.

Subsequently, as shown in FIG. 12, the tungsten film WF is patterned by using the photolithography technique and the etching technique. Thus, the second layer wiring M2 formed of the patterned tungsten film WF can be formed.

Figure 13:
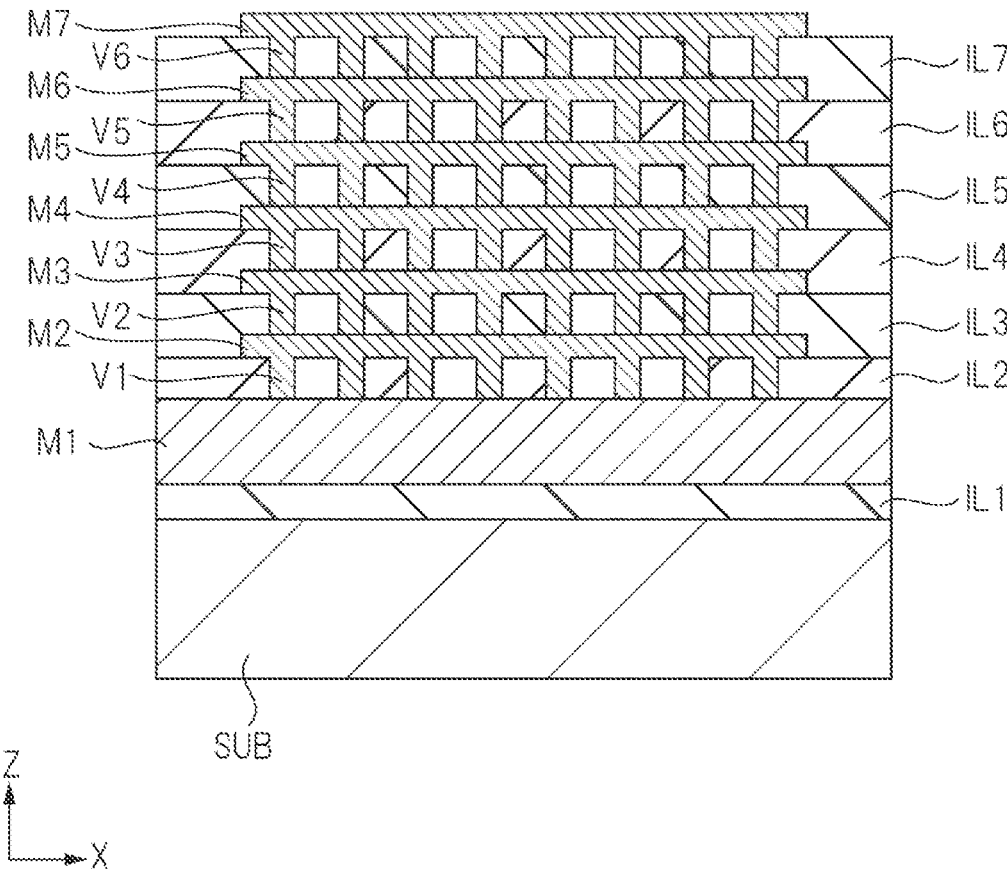
FIG. 13 is a cross-sectional view showing a manufacturing step of the semiconductor chip subsequent to FIG. 12.

Thereafter, the interlayer insulating film forming step, the via-hole forming step, the tungsten film forming step, and the patterning step described with respect to FIGS. 9 to 12 are repeatedly performed to form the third layer wiring M3 to the seventh layer wiring M7, the via-plug V2 to the via-plug V6, and the third interlayer insulating film IL3 to the seventh interlayer insulating film IL7 as shown in FIG. 13.

Figure 14:
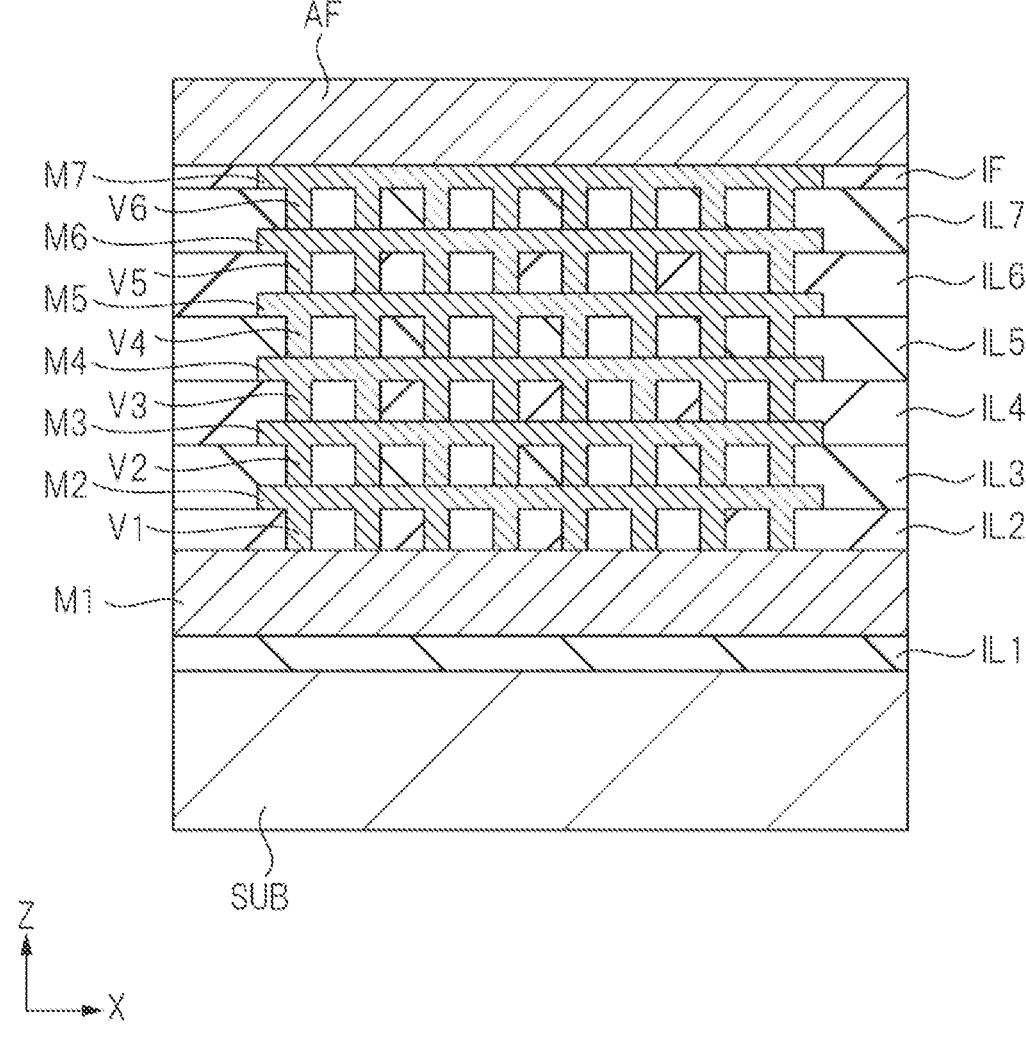
FIG. 14 is a cross-sectional view showing a manufacturing step of the semiconductor chip subsequent to FIG. 13.
Figure 15:
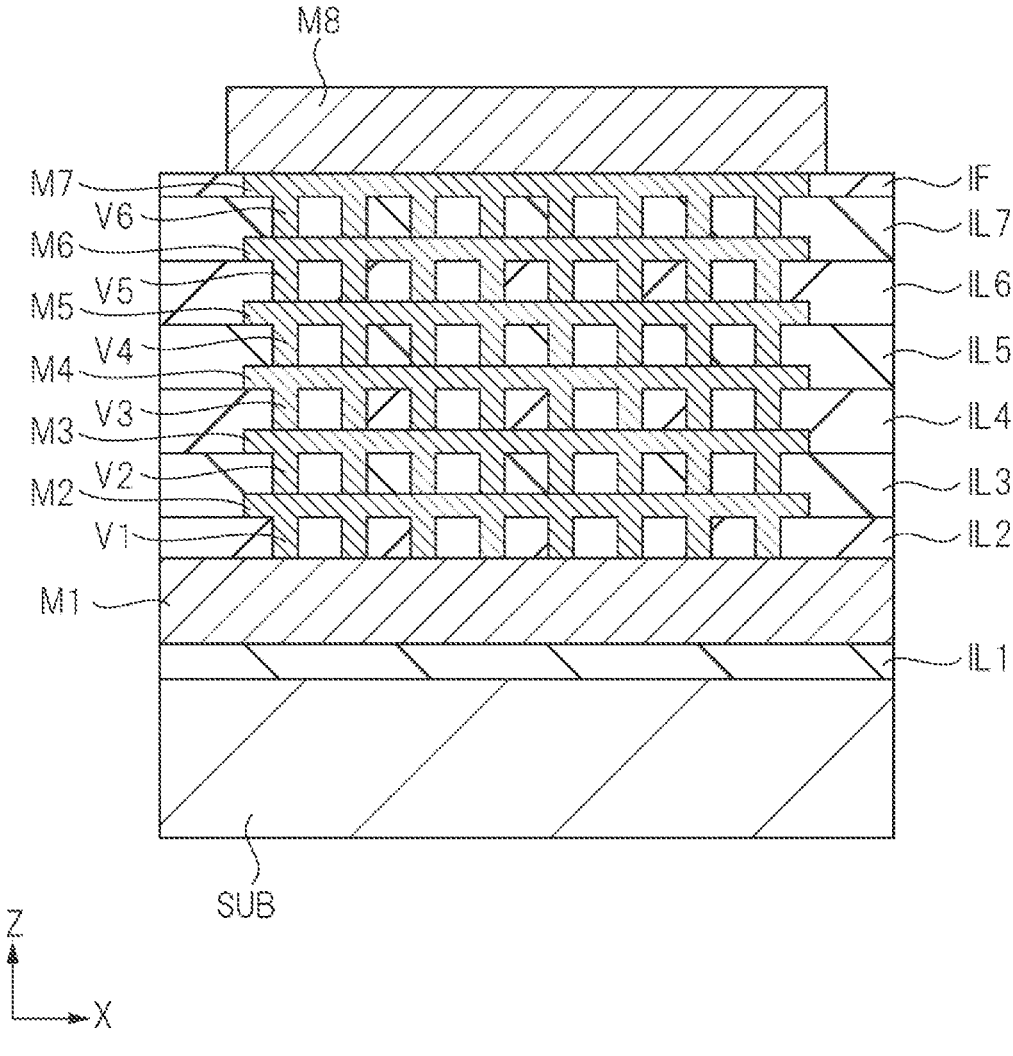
FIG. 15 is a cross-sectional view showing a manufacturing step of the semiconductor chip subsequent to FIG. 14.

Next, as shown in FIG. 14, the insulating film IF is formed on the seventh interlayer insulating film IL7 so as to cover the seventh layer wiring M7. The insulating film IF is formed by, for example, the CVD method. Thereafter, the insulating film IF is subjected to a polishing treatment, whereby the seventh layer wiring M7 is exposed from the insulating film IF. As a result, the insulating film IF is left in the regions where the seventh layer wiring M7 is not formed on the seventh interlayer insulating film IL7. Thereafter, an aluminum film AF is formed on the seventh layer wiring M7. The aluminum film AF can be formed, for example, by using a sputtering method. Thereafter, the aluminum film AF is patterned by using the photolithography technique and the etching technique, as shown in FIG. 15. Thus, the eighth layer wiring M8 formed of the patterned aluminum film AF can be formed, and the upper inductor not shown in FIG. 15 can be formed in the same layer as the eighth layer wiring M8.

Figure 16:
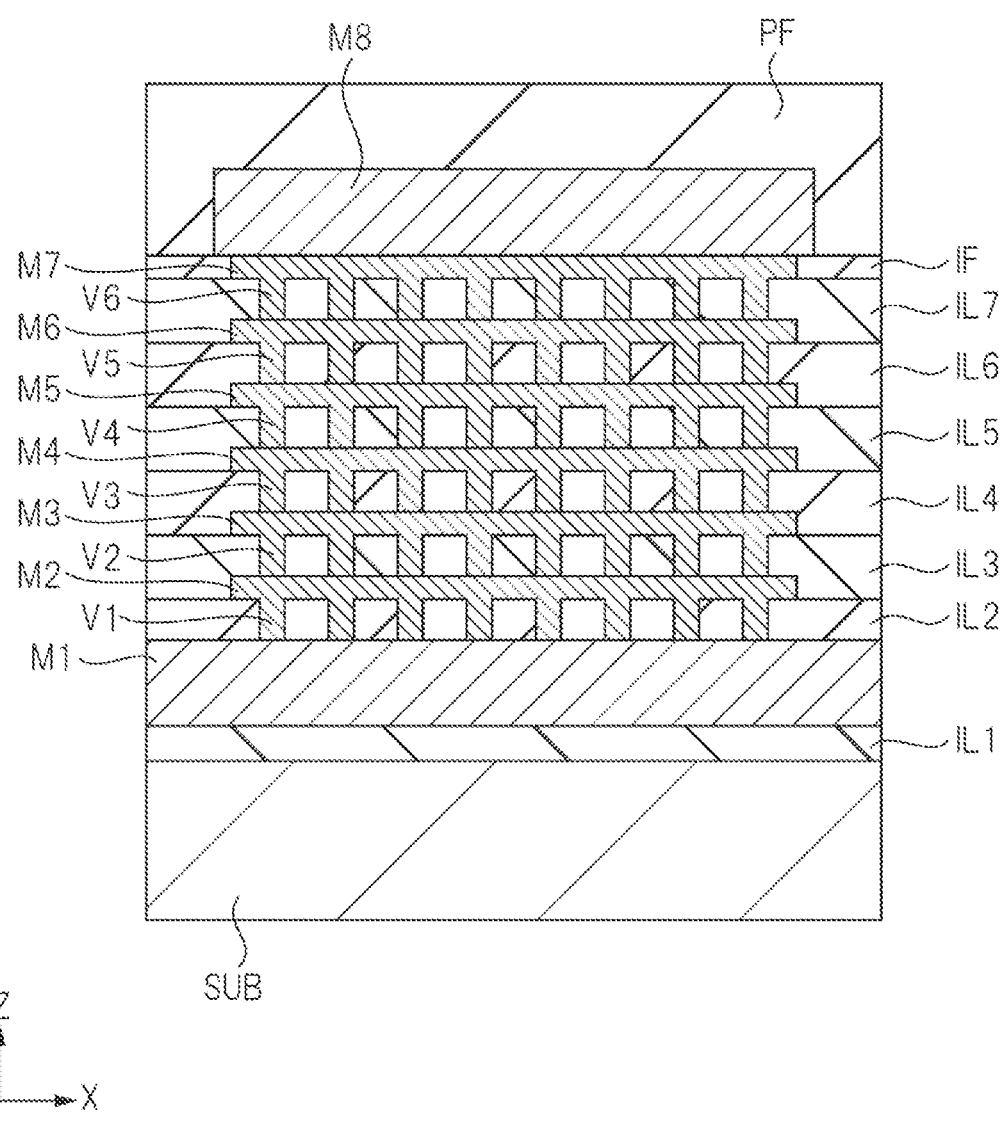
FIG. 16 is a cross-sectional view showing a manufacturing step of the semiconductor chip subsequent to FIG. 15.

Thereafter, as shown in FIG. 16, the protective film PF is formed on the eighth layer wiring M8 and the insulating film IF so as to cover the eighth layer wiring M8. The protective film PF is formed of, for example, the laminated film of the surface protective film and the polyimide resin film. The surface protective film is formed of, for example, a silicon oxide film and a silicon nitride film. Then, as shown in FIG. 8, the openings are formed in the protective film PF by using the photolithography technique and the etching technique. Next, semiconductor chips can be obtained by dicing the semiconductor substrate SUB (semiconductor wafer) having such a configuration along a scribe region provided between adjacent chip regions. The semiconductor chip in the present embodiment can be manufactured as described above.

Features of Manufacturing Method in Embodiment

The features of the manufacturing method in the present embodiment will be described.

In the present embodiment, for example, as shown in FIG. 8, the thickness of each of the second layer wiring M2 to the seventh layer wiring M7 in the Z-direction is smaller than the thickness of the first layer wiring M1 in the Z-direction and the thickness of the eighth layer wiring M8 in the Z-direction. For this reason, for example, in the step shown in FIG. 11, the thickness of the tungsten film WF formed on the second interlayer insulating film IL2 becomes small. Therefore, the flatness of the tungsten film WF can be ensured without polishing by the CMP method. That is, in the present embodiment, the polishing step by the CMP method is not required after the step shown in FIG. 11 because the thickness of the tungsten film WF is small enough to ensure the flatness without using the CMP method. Similarly, in the step of forming the third layer wiring M3 to the seventh layer wiring M7, the polishing step by the CMP method is not required. As a consequence, according to the present embodiment, in each of the steps of forming the second layer wiring M2 to the seventh layer wiring M7, the polishing step by the CMP method is not required, so that it is possible to drastically reduce the number of steps in manufacturing the semiconductor chip according to the present embodiment. Therefore, according to the present embodiment, it is possible to shorten TAT (Turn Around Time) and reduce the manufacturing cost.

Further, according to the feature of the manufacturing method, the following advantages can be obtained.

Unlike the wiring lead-out structure BR of the present embodiment in which the tungsten film WF is not polished after the tungsten film WF is formed, the tungsten film can be polished using the CMP method after the tungsten film is formed to leave the tungsten film WF only in the via-plug. But when the tungsten film is polished to leave the tungsten film only in the via-plug, the lower via-plug (e.g., V1) to the upper via-plug (e.g., V6) are directly stacked vertically without the second layer wiring M2 to the seventh layer wiring M7 being formed therebetween. In such vertical stack structure of the wiring lead-out structure, even when a slight positional deviation of the via-plugs occurs, the parasitic resistance in the Z-direction increases. This means that when the wiring lead-out structure is formed of a vertical stack structure of via-plugs as described above, an increase in parasitic resistance is likely to occur when a current flows in the Z-direction of the vertical stack structure, and as a result, the attenuation of the signal amplitude caused by the parasitic resistance becomes apparent.

On the other hand, for example, in the present embodiment, the polishing step by the CMP method is not performed after the step shown in FIG. 11, and thus, the wiring lead-out structure BR shown in FIG. 7 is realized. In the wiring lead-out structure BR shown in FIG. 7, since the via-plug V1 to the via-plug V6 are not directly stacked vertically and the second layer wiring M2 to the seventh layer wiring M7 are interposed, high resistance due to misalignment in the vertical stacking of the via-plug V1 to the via-plug V6 is suppressed. That is, since the second layer wiring M2 to the seventh layer wiring M7 are interposed, even if the positions of the via-plugs are shifted, the contact areas between the via-plugs and the wiring does not change, and thus the parasitic resistance does not increase. As a result, in the wiring lead-out structure BR shown in FIG. 7, the parasitic resistance when the current flows in the Z-direction can be reduced, and consequently, the attenuation of the signal amplitude caused by the parasitic resistance can be suppressed. As described above, in the step of forming wirings (for example, the second layer wiring M2 to the seventh layer wiring M7) provided in the "multilayer wiring layer", by reducing the thicknesses of wirings provided in the "multilayer wiring layer" to the extent that the polishing step by the CMP method is not required, (1) shortening of TAT by reducing the number of steps and reducing the manufacturing cost, and (2) suppressing the increase in the resistance in the wiring lead-out structure can be realized. That is, features of the manufacturing method in the present embodiment has a great technical significance in that it contributes to reducing the manufacturing cost of the semiconductor device forming the transformer and improving the performance of the transformer.

First Modified Example

Figure 17:
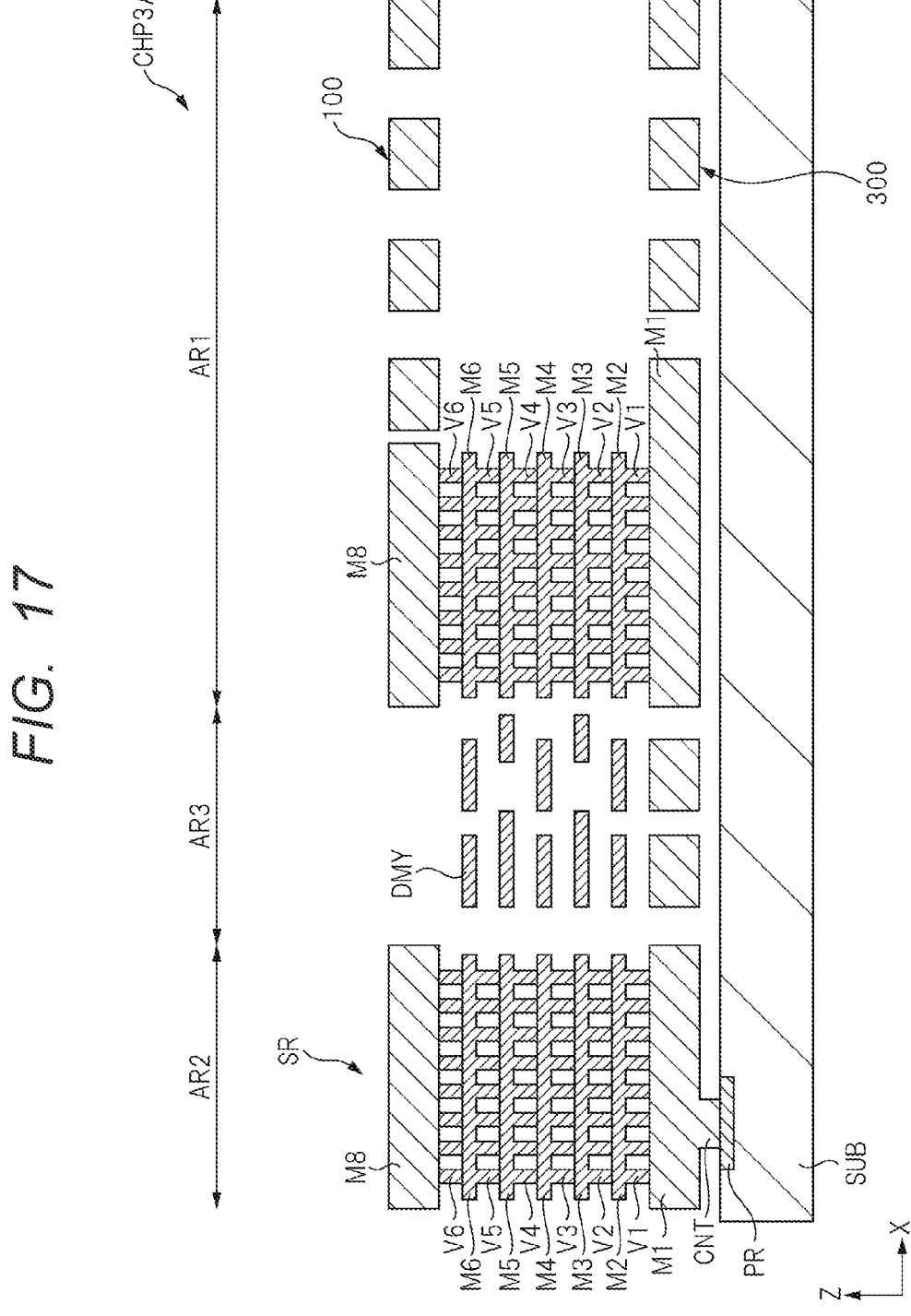
FIG. 17 is a schematic cross-sectional view of a semiconductor chip according to a first modified example.

FIG. 17 is a schematic cross-sectional view of a semiconductor chip CHP3A according to the present first modified example.

In FIG. 17, in the semiconductor chip CHP3A, the eighth layer wiring M8 provided in the "upper wiring layer" directly contacts the plurality of via-plugs V6. That is, in the semiconductor chip CHP3A of the present first modified example shown in FIG. 17, the sixth layer wiring M6 is provided one layer below the "upper wiring layer", and the sixth layer wiring M6 and the eighth layer wiring M8 are electrically connected via the plurality of via-plugs V6 made of tungsten. In this manner, the eighth layer wiring M8 provided in the "upper wiring layer" may be configured to be in direct contact with the plurality of via-plugs V6.

Second Modified Example

Figure 18:
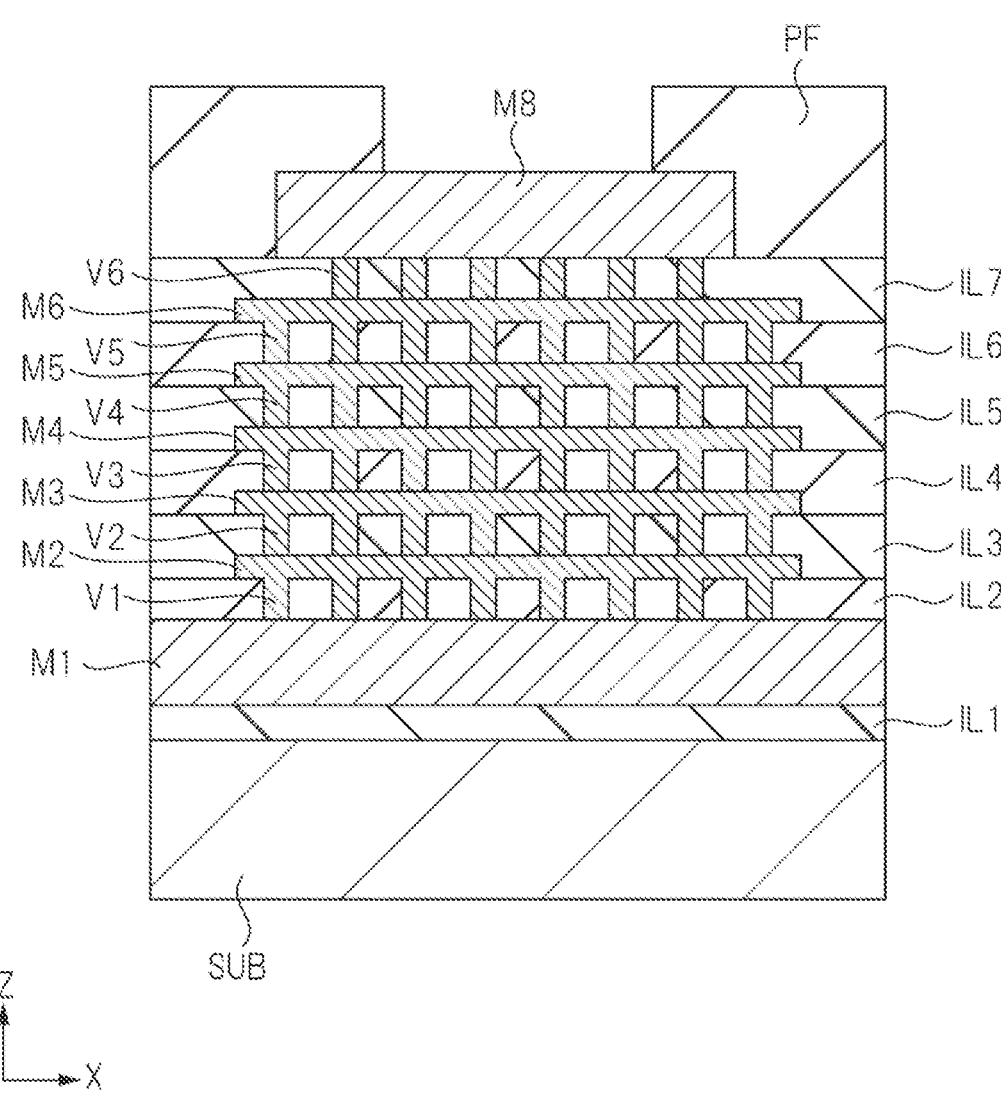
FIG. 18 is a cross-sectional view showing a wiring extraction structure according to a second modified example.

FIG. 18 is a cross-sectional view showing a wiring lead-out structure in the present second modified example.

In FIG. 18, the first layer wiring M1 is provided in the "lower wiring layer". The second layer wiring M2 to the sixth layer wiring M6 are provided in the "multilayer wiring layer" above the "lower wiring layer". The eighth layer wiring M8 is provided in the "upper wiring layer" above the "multilayer wiring layer". In this case, as shown in FIG. 18, in a cross-sectional view, the width of the first layer wiring M1 in the X-direction is larger than the width of each of the second layer wiring M2 to the sixth layer wiring M6 in the X-direction, and the width of the eighth layer wiring M8 in the X-direction is smaller than the width of each of the second layer wiring M2 to the sixth layer wiring M6 in the X-direction. As described above, the width of the eighth layer wiring M8 in the X-direction may be smaller than the width of each of the second layer wiring M2 to the sixth layer wiring M6 in the X-direction.

Third Modified Example

Figure 19:
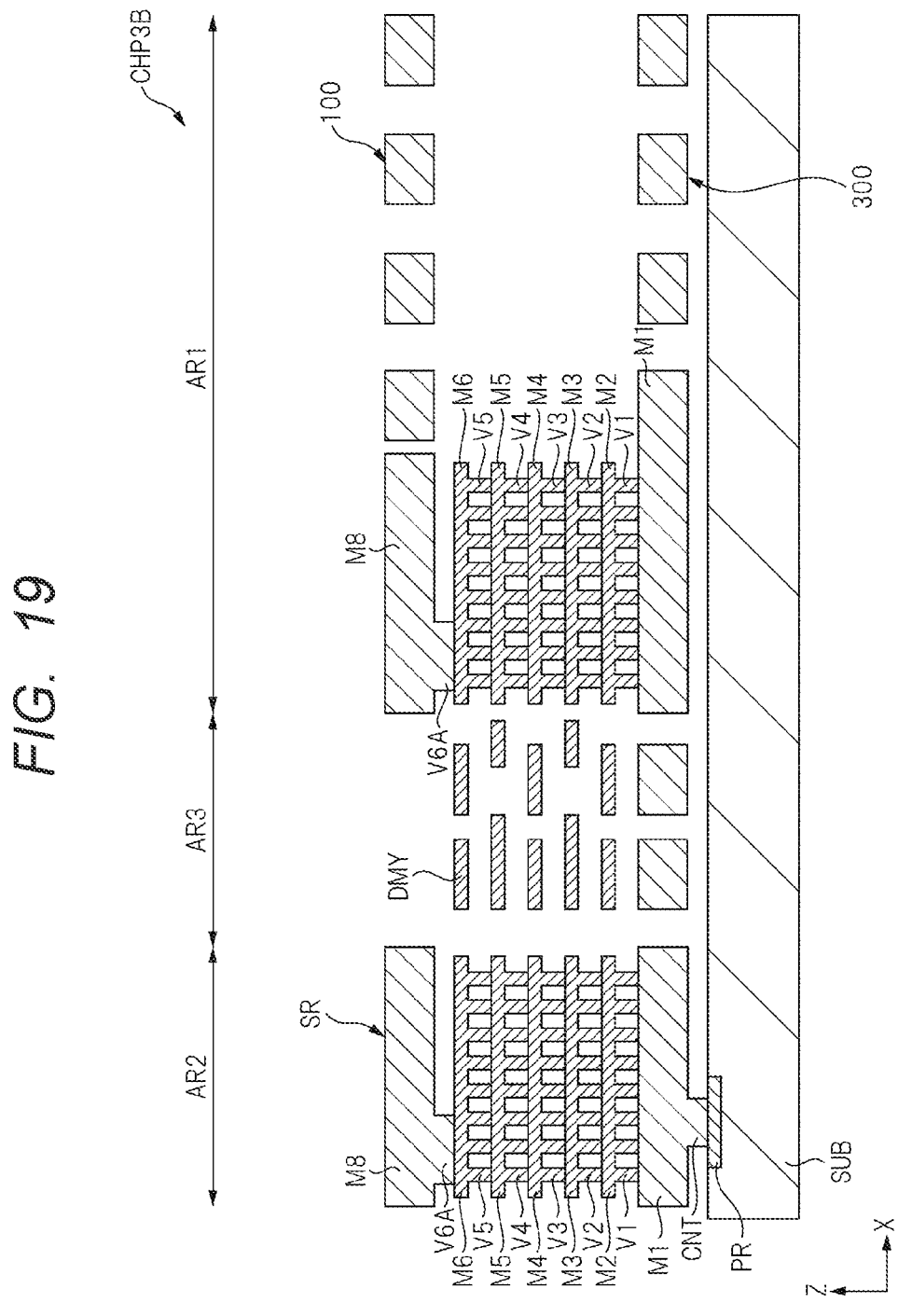
FIG. 19 is a schematic cross-sectional view of a semiconductor chip according to a third modified example.

FIG. 19 is a schematic cross-sectional view of a semiconductor chip CHP3B according to the present third modified example.

In FIG. 19, the "multilayer wiring layer" includes, for example, the fourth wiring layer provided three or more layers below the "upper wiring layer" and the fifth wiring layer formed one layer above the fourth wiring layer. The fourth layer wiring M4 provided in the fourth wiring layer is connected to the fifth layer wiring M5 provided in the fifth wiring layer via the via-plug V4 made of tungsten. On the other hand, among the layer wiring of the "multilayer wiring layer", the sixth layer wiring M6 provided in the sixth wiring layer is provided in one layer below the "upper wiring layer". In this case, the eighth layer wiring M8 provided in the "upper wiring layer" is connected to the sixth layer wiring M6 via a via-plug V6A made of aluminum, and in a cross-sectional view, the width of the via-plug V6A in the X-direction is larger than the width of the via-plug V4 in the X-direction. As described above, the eighth layer wiring M8 may be connected to the sixth layer wiring M6 via the via-plug V6A made of aluminum, and the width of the via-plug V6A in the X-direction may be larger than the width of each of the via-plug V1 to the via-plug V5 made of tungsten in the X-direction.

Fourth Modified Example

Figure 20:
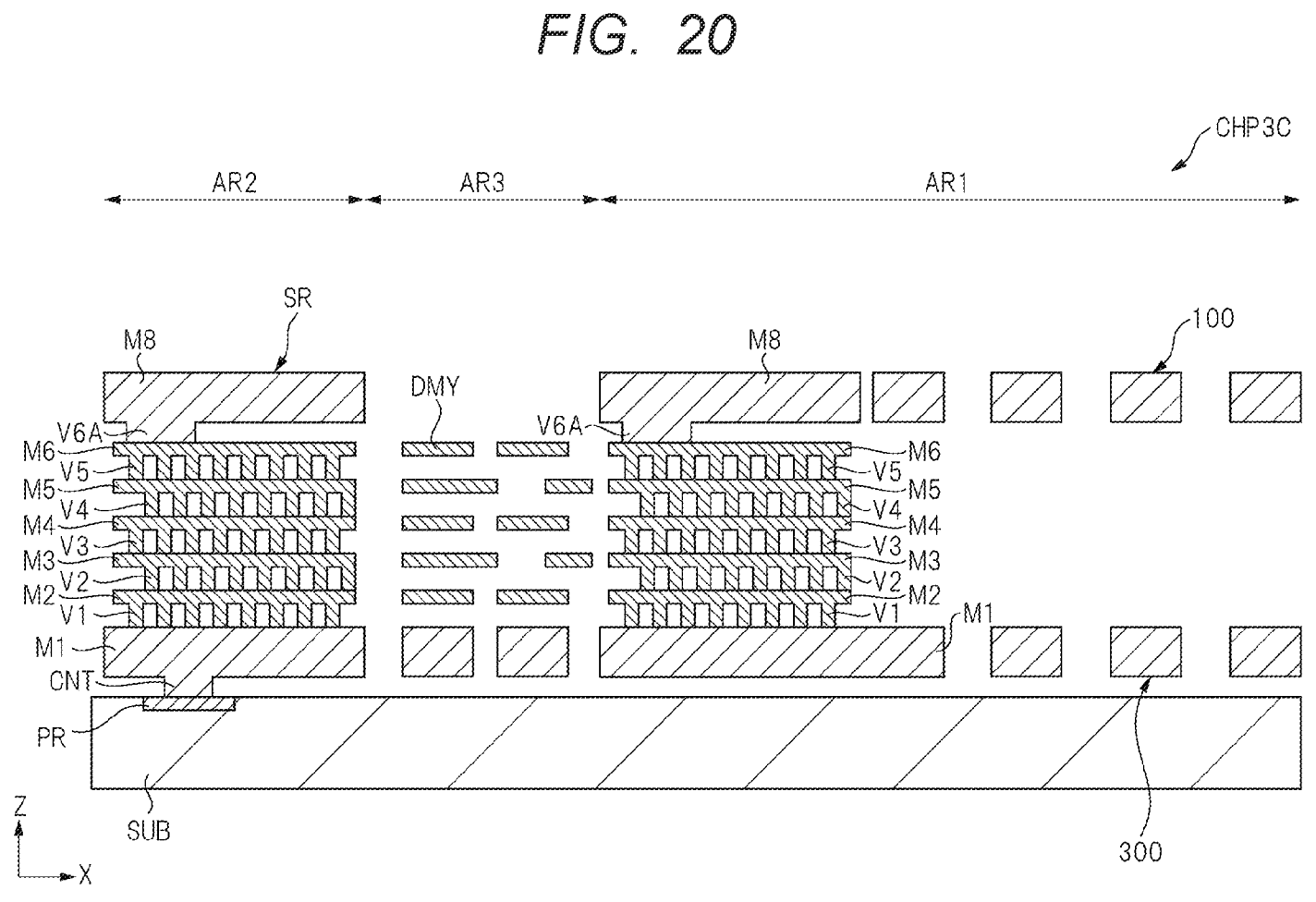

FIG. 20 is a schematic cross-sectional view of a semiconductor chip CHP3C according to the present fourth modified example.

In FIG. 20, the "multilayer wiring layer" includes, for example, the second wiring layer, the third wiring layer formed one layer above the second wiring layer, and the fourth wiring layer formed one layer above the third wiring layer. Here, the second layer wiring M2 provided in the second wiring layer, the third layer wiring M3 provided in the third wiring layer, and the fourth layer wiring M4 provided in the fourth wiring layer are provided in the semiconductor chip CHP3C. In this case, the second layer wiring M2 is connected to the third layer wiring M3 via the via-plug V2, and the third layer wiring M3 is connected to the fourth layer wiring M4 via the via-plug V3.

In a cross-sectional view, the via-plug V2 and the via-plug V3 are shifted from each other. As described above, the via-plugs in each of the positional relationship between the via-plug V1 and the via-plug V2, the positional relationship between the via-plug V2 and the via-plug V3, the positional relationship between the via-plug V3 and the via-plug V4, and the positional relationship between the via-plug V4 and the via-plug V5, do not overlap with each other in cross section. In other words, the via-plug V1 to the via-plug V5 may have a stacked configuration in which the positions thereof are shifted.

Fifth Modified Example

Figure 21:
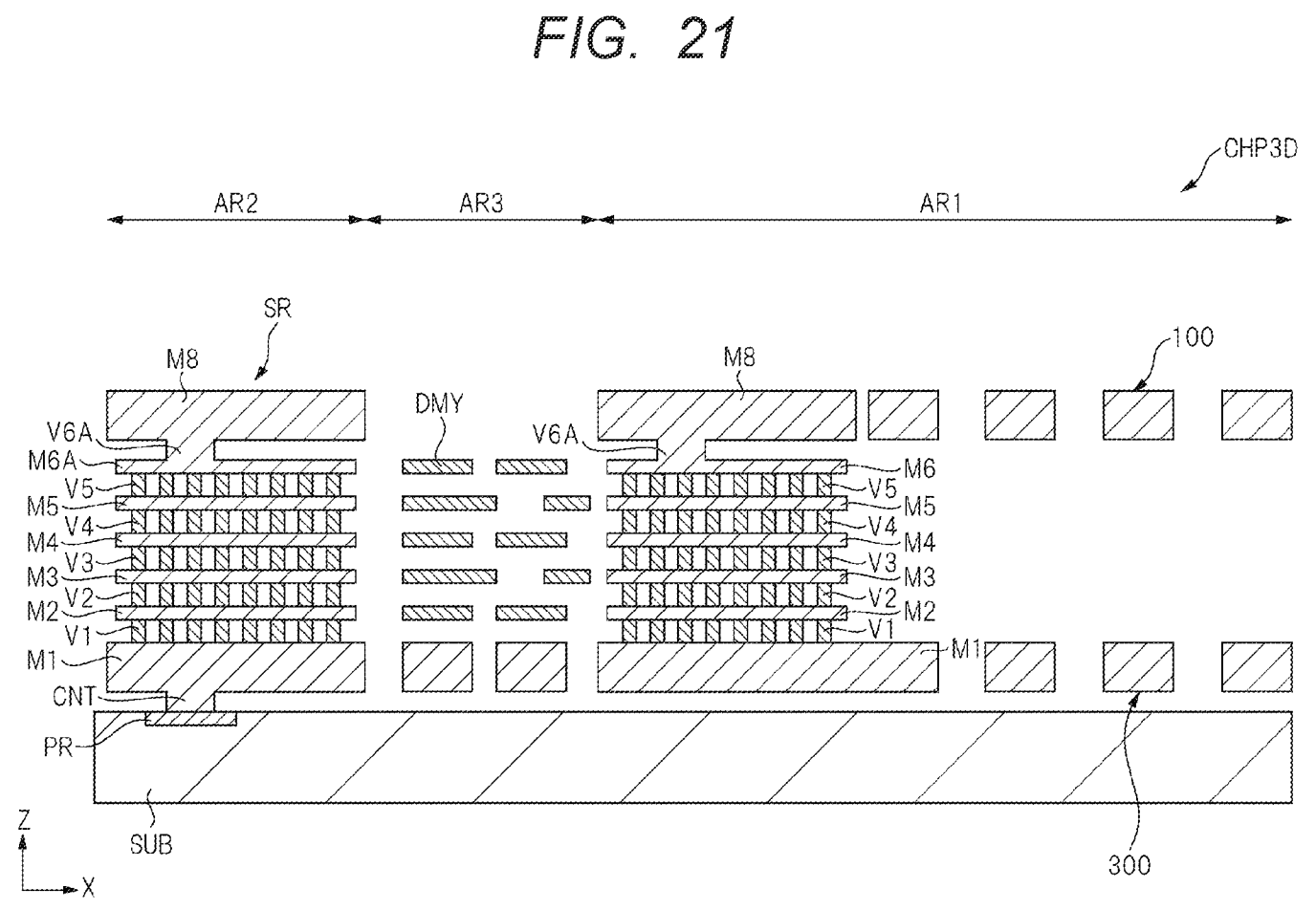

FIG. 21 is a schematic cross-sectional view of a semiconductor chip CHP3D according to the present fifth modified example.

In FIG. 21, not only the first layer wiring M1 provided in the "lower wiring layer" and the eighth layer wiring M8 provided in the "upper wiring layer" but also each of the second layer wiring M2 to the sixth layer wiring M6 provided in the "multilayer wiring layer" may be made of aluminum. That is, the via-plug V1 to the via-plug V5 may be made of tungsten, while each of the second layer wiring M2 to the sixth layer wiring M6 may be made of aluminum instead of tungsten.

Note that the material constituting each of the first layer wiring M1 provided in the "lower wiring layer", the second layer wiring M2 to the sixth layer wiring M6 provided in the "multilayer wiring layer", and the eighth layer wiring M8 provided in the "upper wiring layer" is not particularly limited as long as the material has reverse characteristics to the film stresses of the interlayer insulating film, and for example, copper may be used instead of aluminum and tungsten.

Sixth Modified Example

Figure 22A:
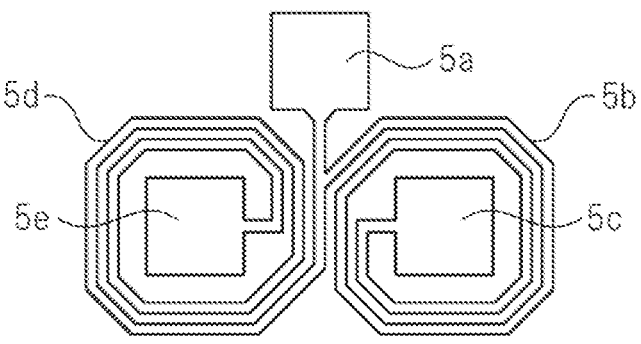
FIGS. 22A and 22B are diagrams showing exemplary shapes of inductors.
Figure 22B:
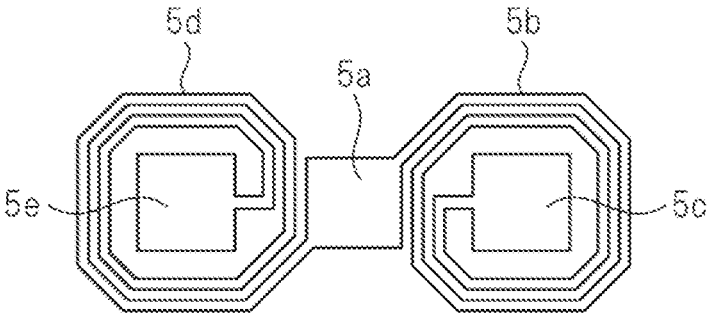

The inductor may have a shape corresponding to differential control. Specifically, the planar shape of the inductor may be, for example, a planar shape shown in FIG. 22A or FIG. 22B. Specifically, as shown in FIGS. 22A and 22B, the inductor may be configured to include a center tap-pad 5*a*, a spiral wiring 5*b*, a trans-pad 5*c*, a spiral wiring 5*d*, and a trans-pad 5*e* corresponding to a pair of differential wirings.

The invention made by the present inventors has been described above in detail based on the embodiment, but the present invention is not limited to the embodiment described above, and it is needless to say that various modifications can be made without departing from the gist thereof.

What is claimed is:

1. A semiconductor device comprising:

a lower wiring layer;

a multilayer wiring layer formed on the lower wiring layer; and an upper wiring layer formed on the multilayer wiring layer, wherein the lower wiring layer includes a first wiring, wherein a second wiring is provided in the multilayer wiring layer, wherein a third wiring is provided in the upper wiring layer, wherein a thickness of the first wiring is larger than a thickness of the second wiring, wherein a thickness of the third wiring is larger than the thickness of the second wiring, wherein a lower inductor which is a component of a transformer is provided in the lower wiring layer, and wherein an upper inductor which is a component of the transformer is provided in the upper wiring layer.

2. The semiconductor device according to claim 1, wherein the first wiring, the second wiring and the third wiring are electrically connected to one another.

3. The semiconductor device according to claim 2, wherein a fourth wiring different from the third wiring is provided in the upper wiring layer, wherein a thickness of the fourth wiring is larger than the thickness of the second wiring, wherein the lower inductor is formed of the first wiring, and wherein the upper inductor is formed of the fourth wiring.

4. The semiconductor device according to claim 3, wherein the third wiring is connected to a first bonding wire configured such that a first potential is applied to the first bonding wire, and wherein the fourth wiring is connected to a second bonding wire configured such that a second potential different from the first potential is applied to the second bonding wire.

5. The semiconductor device according to claim 1, wherein a resistance value of the first wiring is lower than a resistance value of the second wiring, and wherein a resistance value of the third wiring is lower than the resistance value of the second wiring.

6. The semiconductor device according to claim 1, wherein a film stress of the second wiring is larger than a film stress of the first wiring, wherein the film stress of the second wiring is larger than a film stress of the third wiring, wherein the film stress of the second wiring has reverse characteristics for a film stress of an interlayer dielectric film.

7. The semiconductor device according to claim 1, wherein, in cross-sectional view, a width of the first wiring is larger than a width of the second wiring, and wherein, in cross-sectional view, a width of the third wiring is larger than a width of the second wiring.

8. The semiconductor device according to claim 1, wherein, in cross-sectional view, a width of the first wiring is larger than a width of the second wiring, and wherein, in cross-sectional view, a width of the third wiring is smaller than a width of the second wiring.

9. The semiconductor device according to claim 1, wherein the first wiring is an aluminum wiring, wherein the second wiring is a tungsten wiring, and wherein the third wiring is an aluminum wiring.

10. The semiconductor device according to claim 1, wherein the second wiring is provided in a layer one layer below the upper wiring layer, and wherein the second wiring is in contact with the third wiring.

11. The semiconductor device according to claim 1, wherein the second wiring is provided one layer below the upper wiring layer, and wherein the second wiring and the third wiring are connected to each other via a via-plug formed of tungsten.

12. The semiconductor device according to claim 1, wherein the multilayer wiring layer includes:

a first layer provided three or more layers below the upper wiring layer; and a second layer formed one layer above the first layer, wherein a wiring provided in the first layer is connected to a wiring provided in the second layer via a first via-plug formed of tungsten, wherein the second wiring is provided one layer below the upper wiring layer, wherein the second wiring is connected to the third wiring via a second via-plug formed of aluminum, and wherein, in cross-sectional view, a width of the second via-plug is larger than a width of the first via-plug.

13. The semiconductor device according to claim 1, wherein the multilayer wiring layer includes:

a first layer;

a second layer formed one layer above the first layer; and a third layer formed one layer above the second layer, wherein the semiconductor device includes:

a fourth wiring provided in the first layer;

a fifth wiring provided in the second layer; and a sixth wiring provided in the third layer, wherein the fourth wiring is connected to the fifth wiring via a first via-plug, wherein the fifth wiring is connected to the sixth wiring via a second via-plug, and wherein, in plan view, the first via-plug overlaps with the second via-plug.

14. The semiconductor device according to claim 1, wherein the multilayer wiring layer includes:

a first layer;

a second layer formed one layer above the first layer; and a third layer formed one layer above the second layer, wherein the semiconductor device includes:

a fourth wiring provided in the first layer;

a fifth wiring provided in the second layer; and a sixth wiring provided in the third layer, wherein the fourth wiring is connected to the fifth wiring via a first via-plug, wherein the fifth wiring is connected to the sixth wiring via a second via-plug, and wherein, in cross-sectional view, a position of the first via-plug and a position of the second via-plug are shifted from each other.

15. The semiconductor device according to claim 1, wherein the first wiring is an aluminum wiring, wherein the second wiring is an aluminum wiring, and wherein the third wiring is an aluminum wiring.

* * * * *